(12) United States Patent
Maekawa et al.

(10) Patent No.: US 8,620,014 B2
(45) Date of Patent: Dec. 31, 2013

(54) MICROPHONE

(75) Inventors: Tomofumi Maekawa, Osaka (JP);
Naoto Kuratani, Kameoka (JP);
Tsuyoshi Hamaguchi, Otsu (JP)

(73) Assignee: OMRON Corporation, Kyoto-shi, Kyoto (JP)

( * ) Notice: Subject to any disclaimer, the term of this patent is extended or adjusted under 35 U.S.C. 154(b) by 82 days.

(21) Appl. No.: 13/116,435

(22) Filed: May 26, 2011

(65) Prior Publication Data

US 2011/0293126 A1   Dec. 1, 2011

(30) Foreign Application Priority Data

Jun. 1, 2010 (JP) .................................. 2010-126351

(51) Int. Cl.
*H04R 9/08* (2006.01)
*H04R 11/04* (2006.01)
*H04R 17/02* (2006.01)
*H04R 19/04* (2006.01)
*H04R 21/02* (2006.01)
*H04R 25/00* (2006.01)

(52) U.S. Cl.
USPC ........... 381/369; 381/355; 381/170; 381/174; 381/175

(58) Field of Classification Search
USPC .......... 381/170, 174, 175, 355, 369; 257/680, 257/704, 708, 729, 730, 678, 685, 686
See application file for complete search history.

(56) References Cited

U.S. PATENT DOCUMENTS

| 7,166,910 | B2 | 1/2007 | Minervini | |
| 2007/0058826 | A1* | 3/2007 | Sawamoto et al. | 381/174 |
| 2007/0158826 | A1 | 7/2007 | Sakakibara et al. | |
| 2007/0205492 | A1* | 9/2007 | Wang | 257/659 |
| 2008/0175425 | A1 | 7/2008 | Roberts et al. | |
| 2008/0315333 | A1* | 12/2008 | Combi et al. | 257/415 |
| 2010/0067732 | A1 | 3/2010 | Hachinohe et al. | |

FOREIGN PATENT DOCUMENTS

| JP | 2007-150507 A | 6/2007 |
| JP | 2007-180201 A | 7/2007 |
| JP | 2008-271424 A | 11/2008 |
| JP | 2010-068446 A | 3/2010 |

OTHER PUBLICATIONS

Examination Report for Japanese Application No. 2010-126351 dated Nov. 8, 2011, with English translation thereof (8 pages).
Korean Office Action for Application No. 10-2011-0035271, mailed on Mar. 22, 2012 (7 pages).

* cited by examiner

*Primary Examiner* — Duc Nguyen
*Assistant Examiner* — Matthew Eason
(74) *Attorney, Agent, or Firm* — Osha Liang LLP

(57) ABSTRACT

A miniaturized microphone maintaining the properties of a microphone chip and achieving a smaller mounting area. The microphone includes a package which includes a first and second member. At least one of the first second members includes a recess. The microphone also includes a circuit element installed on an inner surface of the first member. Additionally, the microphone includes a microphone chip arranged on a surface on an opposite side of an installing surface of the circuit element.

29 Claims, 17 Drawing Sheets

MICROPHONE

BACKGROUND OF THE INVENTION

1. Technical Field

One or more embodiments of the present invention relate to microphones, and specifically, to a microphone in which a microphone chip (acoustic sensor) is accommodated in a package.

2. Related Art

For example, U.S. Pat. No. 7,166,910 describes a MEMS (Micro Electro Mechanical Systems) microphone manufactured using the MEMS technique. In the microphone described in FIG. 1 of U.S. Pat. No. 7,166,910, a package is configured by a substrate and a cover, a microphone chip and a circuit element are arranged side by side on an upper surface of the substrate, and an acoustic perforation is opened in the cover. Furthermore, in the microphone described in FIG. 31 of U.S. Pat. No. 7,166,910, the microphone chip and the circuit element are arranged side by side on the upper surface of the substrate, and the acoustic perforation is opened in the substrate at the lower surface of the microphone chip. Moreover, in the microphone described in FIG. 32 of U.S. Pat. No. 7,166,910, the microphone chip and the circuit element are arranged side by side on the upper surface of the substrate, and the acoustic perforation is opened in the substrate at a position deviated from the microphone chip.

Miniaturization is demanded on electronic devices particularly portable devices, and to this end, components such as a microphone need to be mounted at high density on a small circuit substrate. However, in all the MEMS microphones described in U.S. Pat. No. 7,166,910, it is difficult to miniaturize the microphone and in particular, it is difficult to reduce the occupying area at the time of mounting (hereinafter referred to as the mounting area) because the microphone chip and the circuit element are arranged side by side on the upper surface of the substrate or the lower surface of the cover.

It is effective to miniaturize the microphone chip and the circuit element themselves in order to miniaturize the microphone, but the sensitivity lowers if the microphone chip is miniaturized. Therefore, it is desired to reduce the dimension while maintaining the properties and to reduce the mounting area in the microphone, but these are difficult in conventional microphones.

SUMMARY OF INVENTION

One or more embodiments of the present invention have been devised to miniaturize the microphone while maintaining the properties of the microphone chip, and in particular, to achieve smaller area of the mounting area.

A first microphone according to one or more embodiments of the present invention includes a package including a cover and a substrate, at least one of which having a recess, a circuit element installed on an inner surface of the cover, and a microphone chip arranged on a surface on an opposite side of an installing surface of the circuit element; wherein the microphone further includes: a microphone terminal arranged on the microphone chip and a plurality of input/output terminals arranged on the circuit element, wherein the microphone terminal and some of the plurality of input/output terminals are connected by a wire wiring, wherein the remaining input/output terminals arranged on the circuit element and a pad portion arranged on a surface facing the substrate of the cover are connected by a wire wiring, and wherein the pad portion arranged on the cover and a pad portion arranged on the substrate are joined by a conductive material.

This is a configuration for a case where the circuit element and the microphone chip are mounted on the inner surface of the cover with the microphone chip mounted on the circuit element. In the first microphone of one or more embodiments of the present invention, the microphone can be miniaturized by effectively using the vertical space in the package because the circuit element and the microphone chip are accommodated in the package with the microphone chip stacked on the circuit element. In particular, the bottom area of the package can be reduced compared to the case where the circuit element and the microphone chip are arranged side by side, so that the mounting area of the microphone can be reduced. Furthermore, the performance of the microphone does not lower because the microphone chip and the circuit element themselves do not need to be reduced in size to miniaturize the microphone.

Further, in the first microphone according to one or more embodiments of the present invention, the cover can be joined to the substrate after the wiring task by the wire wiring is completed in only the cover. Even if the circuit element and the microphone chip are mounted on the cover, the circuit element and the microphone chip can be connected to the substrate by joining the pad portion of the cover and the pad portion of the substrate with the conductive material. Therefore, the assembly task of the microphone can be easily carried out. Furthermore, higher reliability and lower cost of the microphone can be achieved because the structure is simple.

A second microphone according to one or more embodiments of the present invention includes a package including a cover and a substrate, at least one of which having a recess, a microphone chip installed on an inner surface of the cover, and a circuit element arranged on a surface on an opposite side of an installing surface of the microphone chip; wherein the microphone further includes: a microphone terminal arranged on the microphone chip and a plurality of input/output terminals arranged on the circuit element, wherein the microphone terminal and some of the plurality of input/output terminals are connected by a wire wiring, wherein the remaining input/output terminals arranged on the circuit element and a pad portion arranged on a surface facing the substrate of the cover are connected by a wire wiring, and the pad portion arranged on the cover and a pad portion arranged on the substrate are joined by a conductive material.

This is a configuration for a case where the microphone chip and the circuit element are mounted on the inner surface of the cover with the circuit element mounted on the microphone chip. In the second microphone of one or more embodiments of the present invention, the microphone can be miniaturized by effectively using the vertical space in the package because the circuit element and the microphone chip are accommodated in the package with the circuit element stacked on the microphone chip. In particular, the bottom area of the package can be reduced compared to the case where the circuit element and the microphone chip are arranged side by side, so that the mounting area of the microphone can be reduced. Furthermore, the performance of the microphone does not lower because the microphone chip and the circuit element themselves do not need to be reduced in size to miniaturize the microphone.

Further, in the second microphone according to one or more embodiments of the present invention, the cover can be joined to the substrate after the wiring task by the wire wiring is completed in only the cover. Even if the circuit element and the microphone chip are mounted on the cover, the circuit element and the microphone chip can be connected to the substrate by joining the pad portion of the cover and the pad portion of the substrate with the conductive material. Therefore, the assembly task of the microphone can be easily carried out. Furthermore, higher reliability and lower cost of the microphone can be achieved because the structure is simple.

A third microphone according to one or more embodiments of the present invention includes a package including a cover and a substrate, at least one of which having a recess, a circuit element installed on an inner surface of the cover, and a microphone chip arranged on a surface on an opposite side of an installing surface of the circuit element; wherein the microphone further includes: a microphone terminal arranged on the microphone chip and a plurality of input/output terminals arranged on the circuit element, wherein the microphone terminal and some of the plurality of input/output terminals are connected by a through-wiring arranged in the microphone chip, and the remaining input/output terminals arranged on the circuit element and a pad portion arranged on a surface facing the substrate of the cover are connected by a wire wiring, and the pad portion arranged on the cover and a pad portion arranged on the substrate are joined by a conductive material.

This is a configuration for a case where the circuit element and the microphone chip are mounted on the inner surface of the cover with the microphone chip mounted on the circuit element.

In the third microphone of one or more embodiments of the present invention, the microphone can be miniaturized by effectively using the vertical space in the package because the circuit element and the microphone chip are accommodated in the package with the microphone chip stacked on the circuit element. In particular, the bottom area of the package can be reduced compared to the case where the circuit element and the microphone chip are arranged side by side, so that the mounting area of the microphone can be reduced. Furthermore, the performance of the microphone does not lower because the microphone chip and the circuit element themselves do not need to be reduced in size to miniaturize the microphone.

Further, in the third microphone according to one or more embodiments of the present invention, the cover can be joined to the substrate after the wiring task by the wire wiring or the through-wiring is completed in only the cover. Even if the circuit element and the microphone chip are mounted on the cover, the circuit element and the microphone chip can be connected to the substrate by joining the pad portion of the cover and the pad portion of the substrate with the conductive material. Therefore, the assembly task of the microphone can be easily carried out. Furthermore, higher reliability and lower cost of the microphone can be achieved because the structure is simple.

A fourth microphone according to one or more embodiments of the present invention includes a package including a cover and a substrate, at least one of which having a recess, a microphone chip installed on an inner surface of the cover, and a circuit element arranged on a surface on an opposite side of an installing surface of the microphone chip; wherein the microphone further includes: a microphone terminal arranged on the microphone chip and a plurality of input/output terminals arranged on the circuit element, wherein the microphone terminal and some of the plurality of input/output terminals are connected by a through-wiring arranged in the circuit element, wherein the remaining input/output terminals arranged on the circuit element and a pad portion arranged on a surface facing the substrate of the cover are connected by a wire wiring, and the pad portion arranged on the cover and a pad portion arranged on the substrate are joined by a conductive material.

This is a configuration for a case where the circuit element and the microphone chip are mounted on the inner surface of the cover with the circuit element mounted on the microphone chip.

In the fourth microphone of one or more embodiments of the present invention, the microphone can be miniaturized by effectively using the vertical space in the package because the circuit element and the microphone chip are accommodated in the package with the circuit element stacked on the microphone chip. In particular, the bottom area of the package can be reduced compared to the case where the circuit element and the microphone chip are arranged side by side, so that the mounting area of the microphone can be reduced. Furthermore, the performance of the microphone does not lower because the microphone chip and the circuit element themselves do not need to be reduced in size to miniaturize the microphone.

Further, in the fourth microphone according to one or more embodiments of the present invention, the cover can be joined to the substrate after the wiring task by the wire wiring or the through-wiring is completed in only the cover. Even if the circuit element and the microphone chip are mounted on the cover, the circuit element and the microphone chip can be connected to the substrate by joining the pad portion of the cover and the pad portion of the substrate with the conductive material. Therefore, the assembly task of the microphone can be easily carried out. Furthermore, higher reliability and lower cost of the microphone can be achieved because the structure is simple.

The input/output terminal of one or more embodiments of the present invention may function as both an input terminal and an output terminal, may function as an input terminal, or may function as an output terminal (the same is true hereinafter).

The acoustic perforation for transmitting the acoustic vibration into the package may be arranged in the member in which the microphone chip and the circuit element are arranged out of the cover and the substrate (namely, the cover), or may be arranged in a different member (namely, the substrate). The acoustic perforation may adopt various aspects described below. First, the acoustic perforation may be arranged in the cover. This is the case of arranging the acoustic perforation in the member in which the microphone chip and the circuit element are arranged.

In another aspect, in the first or third microphone in which the circuit element is mounted on the cover and the microphone chip is arranged on the front surface thereof, the acoustic perforation is arranged in continuation to the cover and the circuit element, so that the opening of the acoustic perforation at the outer surface side of the cover and the opening of the acoustic perforation at the inner surface side of the circuit element may at least partially overlap when viewed from the direction perpendicular to the bottom surface of the package. According to such an aspect, the acoustic vibration can be easily transmitted to the package.

In still another aspect, in the first or third microphone in which the circuit element is mounted on the cover and the microphone chip is arranged on the front surface thereof, the acoustic perforation is arranged in continuation to the cover and the circuit element, so that the opening of the acoustic perforation at the outer surface side of the cover and the opening of the acoustic perforation at the inner surface side of the circuit element may not overlap when viewed from the direction perpendicular to the bottom surface of the package. According to such an acoustic perforation, foreign substances can be prevented from entering the package or the microphone chip from the acoustic perforation, and environmental factors such as light or moisture can be prevented from entering from the acoustic perforation so that the microphone chip and the circuit element are less likely to be affected.

In yet another aspect, in the first or third microphone in which the circuit element is mounted on the cover, and the microphone chip is arranged on the front surface thereof, the acoustic perforation is arranged in continuation to the cover and the circuit element, so that the acoustic perforation may be bent so that the opening on the inner surface side of the circuit element is not linearly viewed from the opening on the outer surface side of the cover. According to such an acoustic perforation, foreign substances can be prevented from entering the package or the microphone chip from the acoustic perforation, and environmental factors such as light or moisture can be prevented from entering from the acoustic perforation so that the microphone chip and the circuit element are less likely to be affected.

In yet another aspect, in the second or fourth microphone in which the microphone chip is mounted on the cover and the circuit element is arranged on the front surface thereof, the acoustic perforation for transmitting the acoustic vibration to the package may be arranged in the cover so that at least one part faces the diaphragm of the microphone chip when viewed from the direction perpendicular to the bottom surface of the package. According to such an aspect, the acoustic vibration can be easily transmitted to the diaphragm, so that the sensitivity of the microphone can be enhanced.

The acoustic perforation may be formed in the substrate. This is a case in which the acoustic perforation is formed in a member different from the member on which the microphone chip and the circuit element are arranged.

Further, in such an aspect, the acoustic perforation may be bent so that the opening on the inner surface side of the substrate cannot be linearly viewed from the opening on the outer surface side of the substrate. According to such an acoustic perforation, foreign substances can be prevented from entering the package or the microphone chip from the acoustic perforation, and environmental factors such as light or moisture can be prevented from entering from the acoustic perforation so that the microphone chip and the circuit element are less likely to be affected.

At least one of the cover or the substrate is desirably configured by at least one type of material including copper laminated stacked plate, glass epoxy, ceramic, plastic, metal, or carbon nano tube.

One or more embodiments of the present invention has a characteristic of appropriately combining the configuring elements described above, and the one or more embodiments of the present invention enables a great number of variations by the combination of the configuring elements.

DETAILED DESCRIPTION

Hereinafter, preferred embodiments of the present invention will be described with reference to the accompanying drawings. It should be noted that the present invention is not limited to the following embodiments, and that various design changes can be made within a scope not deviating from the present invention. In embodiments of the invention, numerous specific details are set forth in order to provide a more thorough understanding of the invention. However, it will be apparent to one with ordinary skill in the art that the invention may be practiced without these specific details. In other instances, well-known features have not been described in detail to avoid obscuring the invention.

First Embodiment

Figure 1A:
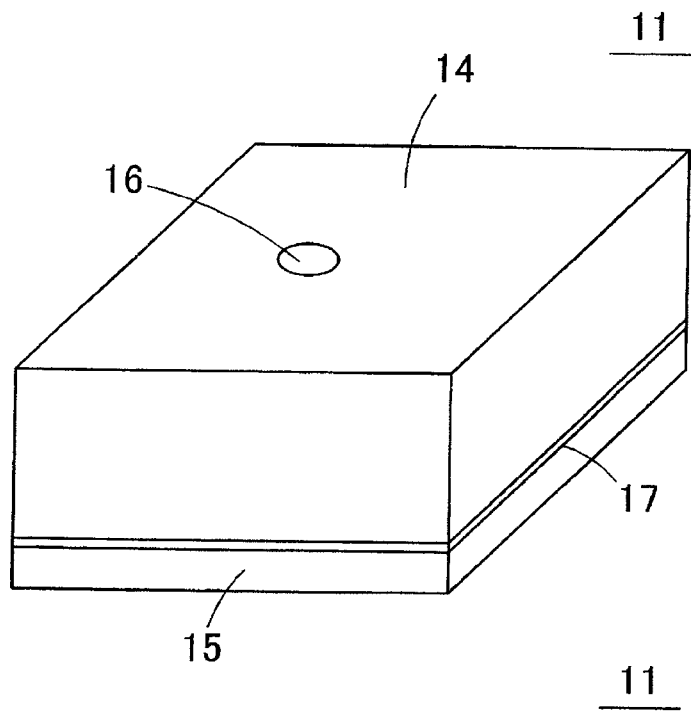
FIG. 1A is a perspective view from an upper surface side of a microphone according to a first embodiment of the present invention.
Figure 1B:
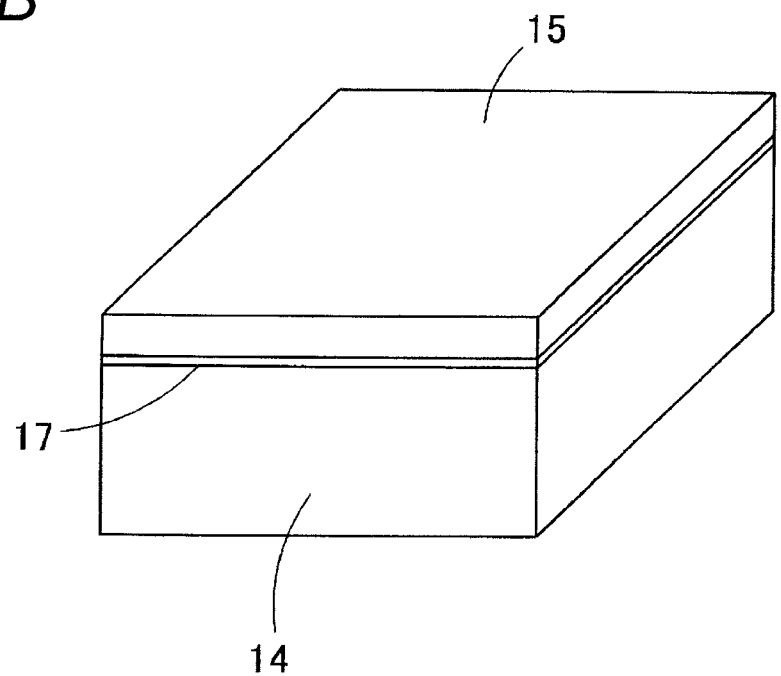
FIG. 1B is a perspective view from a lower surface side of the microphone of the first embodiment.
Figure 2A:
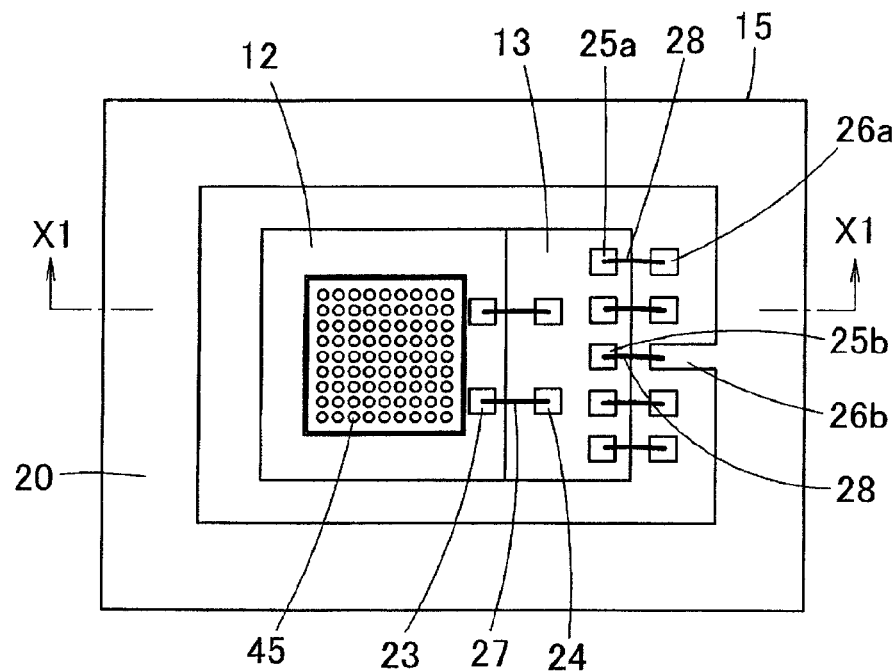
FIG. 2A is a plan view showing a substrate of the microphone of the first embodiment.
Figure 2B:
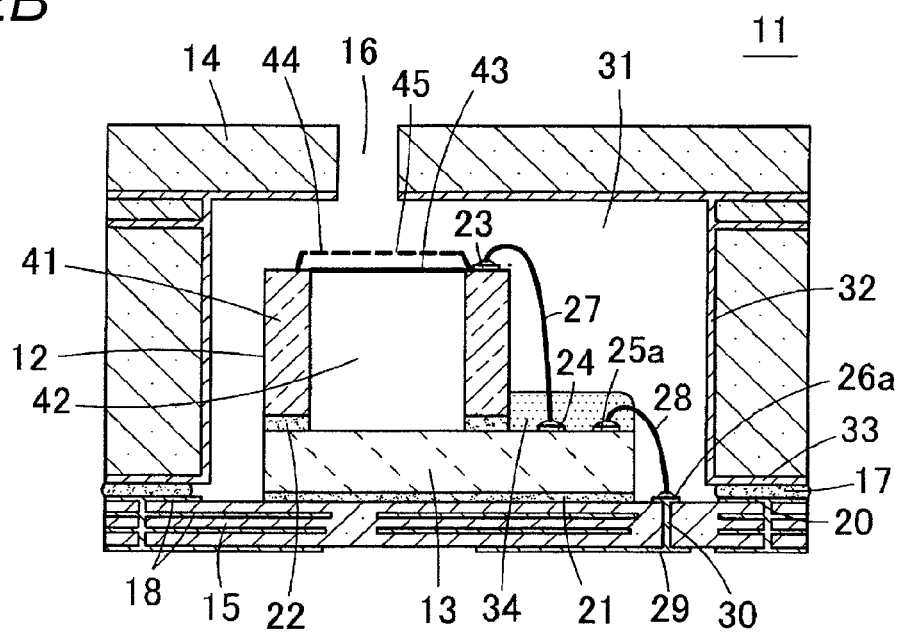
FIG. 2B is a cross-sectional view of the microphone of the first embodiment taken along a portion corresponding to line X1-X1 in FIG. 2A.

An upper surface sound hole type microphone 11 according to a first embodiment of the present invention will be described with reference to FIGS. 1A and 1B, and FIGS. 2A and 2B. FIGS. 1A and 1B are a perspective view from an upper surface side and a perspective view from a lower surface side of the microphone 11 according to the first embodiment. FIG. 2A is a plan view of a substrate 15 on which a microphone chip 12 and a circuit element 13 are mounted, and FIG. 2B is a cross-sectional view of the microphone 11 taken along an area corresponding to line X1-X1 in FIG. 2A. Such a microphone 11 is a MEMS microphone manufactured using the MEMS technique, where the microphone chip 12 and the circuit element 13 are accommodated in a package made from a cover 14 (one of a cover or a substrate) and a substrate 15 (other one of the cover or the substrate). The structure of the microphone 11 will be specifically described below.

As shown in FIGS. 2A and 2B, the substrate 15 is formed by a flat plate shaped multi-layer wiring substrate, where a conductive layer 18 for electromagnetic shield is arranged substantially entirely. A substrate side joining portion 20 is formed by the conductive layer 18 at an outer peripheral part of the upper surface of the substrate 15. A plurality of pad portions 26a conducted to an external connection terminal 29 at the back surface through a through hole 30 and a pad portion 26b conducted to the substrate side joining portion 20 are arranged on the upper surface of the substrate 15.

The lower surface of the circuit element 13 such as an IC chip is adhered to the upper surface of the substrate 15 by a die attach material 21 made of an insulating or conductive adhesive, or the like. The entire periphery of the lower surface of the microphone chip 12 is adhered to the upper surface of the circuit element 13 by a die attach material 22 made of an insulating or conductive adhesive, or the like.

The microphone chip 12 is mainly configured by an Si substrate 41, through which a chamber 42 (back chamber) passes in the up and down direction, a diaphragm 43 including a polysilicon thin film, and a back plate 44. The diaphragm 43 is arranged to cover the chamber 42 while slightly floating from the upper surface of the Si substrate 41, and sympathizes to acoustic vibration to film vibrate. The back plate 44 is configured by a fixed portion including SiN and a fixed electrode including a polysilicon thin film, where a great number of acoustic holes 45 for passing the acoustic vibration are opened in the back plate 44. In such a microphone chip 12, the diaphragm 43 and the fixed electrode of the back plate 44 configure a capacitor, where when the diaphragm 43 vibrates by the acoustic vibration, an electrostatic capacity between the diaphragm 43 and the fixed electrode of the back plate 44 changes according to the acoustic vibration. At least a pair of microphone terminals 23 is provided on the front surface of the microphone chip 12, and a detection signal corresponding to the change in the electrostatic capacity between the diaphragm 43 and the fixed electrode is output from the microphone terminals 23.

At least a pair of MEMS input/output terminals 24, and a plurality of external connection input/output terminals 25a and ground terminals 25b are provided on the upper surface of the circuit element 13. The microphone terminal 23 of the microphone chip 12 and the input/output terminal 24 of the circuit element 13 are connected by a bonding wire 27 (wire wiring). The input/output terminal 25a of the circuit element 13 is connected to the pad portion 26a of the substrate 15 by a bonding wire 28 (wire wiring), and the ground terminal 25b of the circuit element 13 is connected to the pad portion 26b of the substrate 15 by the bonding wire 28. Thus, the detection signal output from the microphone chip 12 is input into the circuit element 13 from the input/output terminal 24, and output from the input/output terminal 25a to the external connection terminal 29 after a predetermined signal processing is performed. The region where the input/output terminals 24, 25a and the ground terminal 25b are arranged in the upper surface of the circuit element 13 may be covered with a protective material 34 made of insulating resin, or the like.

Other than the multi-layer wiring substrate, the substrate 15 may be formed by a copper laminated stacked plate, a glass epoxy substrate, a ceramic substrate, a plastic substrate, a metal substrate, a carbon nano tube substrate, or a compound substrate thereof. For example, the substrate 15 manufactured by performing plating on a front surface of a plate of a plastic molded article may be used. A recess for accommodating the circuit element 13 may be formed at the upper surface of the substrate 15.

As shown in FIG. 2B, the cover 14 is formed to a box shape, and includes a recess 31 at the lower surface. A conductive layer 32 for electromagnetic shield is formed substantially entirely on the top surface and the side wall surfaces of the recess 31 as well as the lower surface of the side wall surrounding the recess 31. The conductive layer 32 formed on the top surface of the cover 14 extends to the interior of the insulating material. The conductive layer 32 at the lower surface of the side wall becomes a cover side joining portion 33 to be joined with the substrate 15. The cover 14 is formed by performing plating on the inner surface and the lower surface of the cover main body made from at least one material of a copper laminated stacked plate or a glass epoxy, ceramic, plastic, metal, or carbon nano tube or a complex material thereof. For example, the cover 14 in which plating is performed on the front surface of the plastic molded article integrally molded to a cover shape may be used.

The cover 14 is overlapped on the upper surface of the substrate 15 with the recess 31 facing the lower side, and the cover side joining portion 33 and the substrate side joining portion 20 are joined by the conductive material 17. The package is configured by the cover 14 and the substrate 15 integrated in such a manner, and the microphone chip 12 and the circuit element 13 are accommodated in the package. One of a conductive adhesive or solder, a conductive both-sided adhesive tape, or a wax material for welding may be used or a plurality of materials of the same may be simultaneously used for the conductive material 17. A non-conductive resin or a non-conductive tape may be simultaneously used to laminate the cover 14 and the substrate 15.

As a result of joining the cover side joining portion 33 and the substrate side joining portion 20 with the conductive material 17, the conductive layer 32 of the cover 14 and the conductive layer 18 of the substrate 15 are conducted, so that the conductive layers 32 and 18 are held at ground potential by connecting the conductive layer 18 to an earth line such as a circuit substrate, and the microphone 11 is shielded from the external electromagnetic noise.

An acoustic perforation 16 that enters the acoustic vibration into the package is opened in the upper surface of the cover 14, where the acoustic vibration that entered the package from the acoustic perforation 16 reaches the diaphragm 43 through the acoustic hole 45 and vibrates the diaphragm 43.

In the microphone 11 of the first embodiment of the present invention, that in which the microphone chip 12 is stacked on the circuit element 13 is mounted on the upper surface of the substrate 15, and hence the vertical space of the package can be used and the microphone 11 can be miniaturized. In particular, the mounting area of the microphone 11 can be reduced compared to the microphone in which the circuit element and the microphone chip are arranged side by side, and thus it is suited for high density mounting. Furthermore, the properties of the microphone chip 12 do not lower because the microphone chip 12 itself does not need to be miniaturized to miniaturize the microphone 11.

In the manufacturing process of the microphone 11, the microphone chip 12 and the circuit element 13 can be connected with the bonding wire 27 and the circuit element 13 and the substrate 15 can be connected with the bonding wire 28 with the circuit element 13 installed on the upper surface of the substrate 15 and the microphone chip 12 installed thereon. Accordingly, the cover 14 can be joined onto the substrate 15 after all the wiring tasks are completed, and the assembly task can be easily carried out. The cost is also inexpensive because the microphone 11 has a simple structure.

Second Embodiment

Figure 3A:
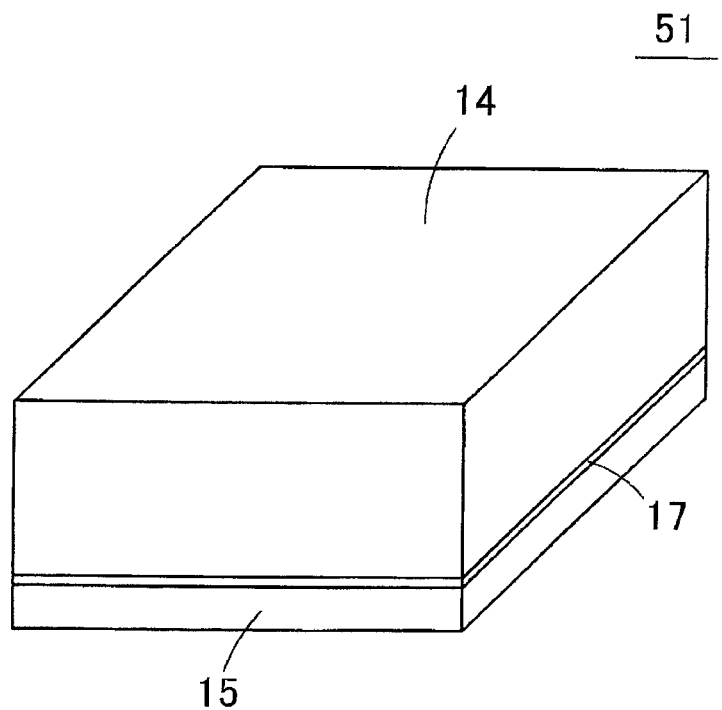
FIG. 3A is a perspective view from an upper surface side of a microphone according to a second embodiment of the present invention.
Figure 3B:
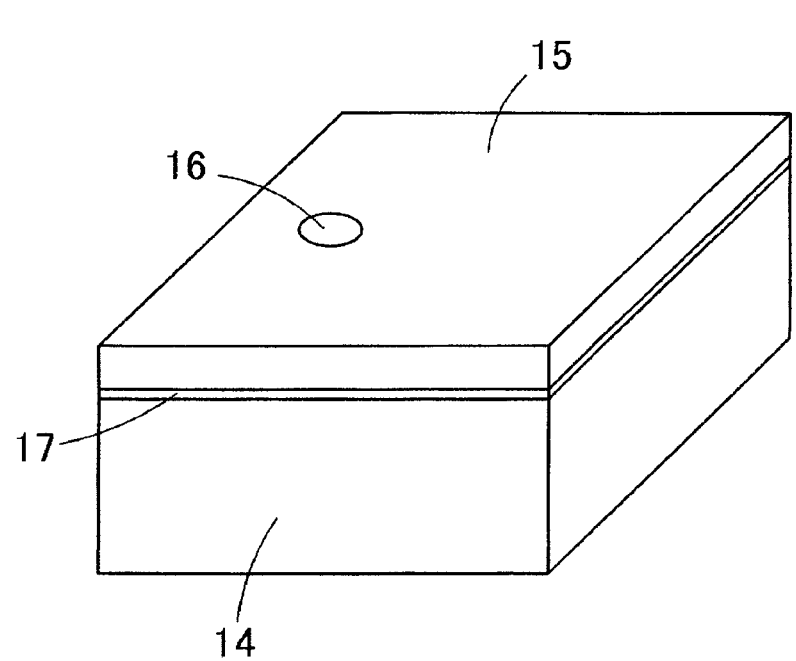
FIG. 3B is a perspective view from a lower surface side of the microphone of the second embodiment.
Figure 4A:
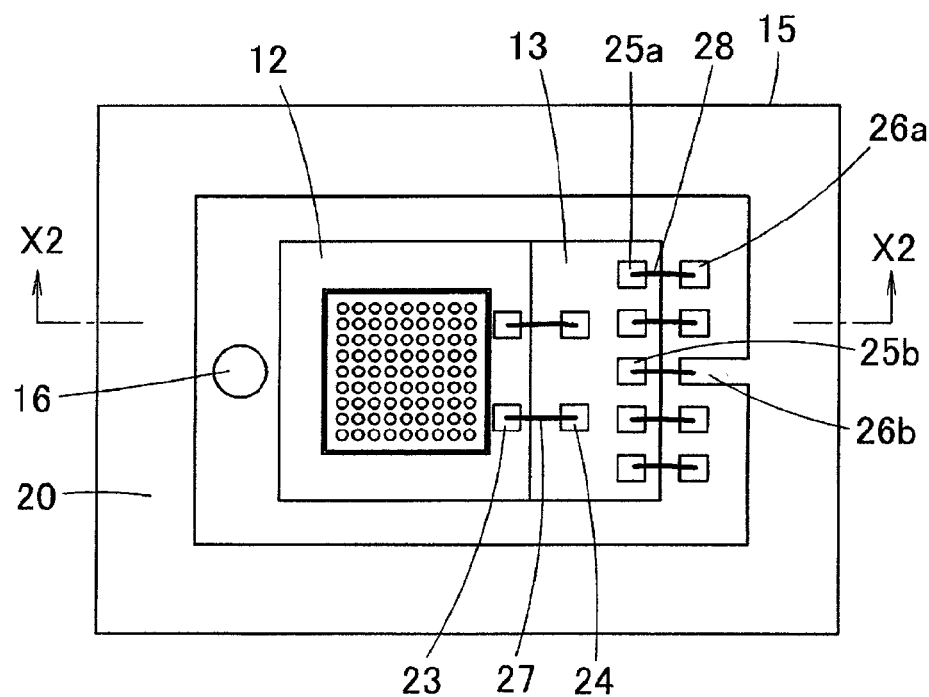
FIG. 4A is a plan view showing a substrate of the microphone of the second embodiment.
Figure 4B:
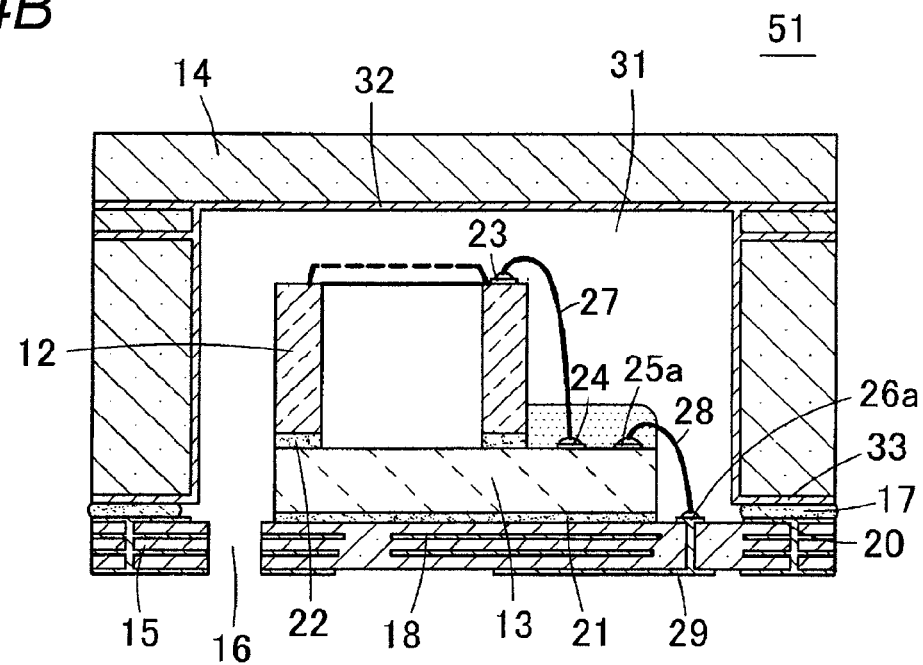
FIG. 4B is a cross-sectional view of the microphone of the second embodiment taken along a portion corresponding to line X2-X2 in FIG. 4A.

FIGS. 3A and 3B are a perspective view from an upper surface side and a perspective view from a lower surface side of a microphone 51 according to a second embodiment of the present invention. FIG. 4A is a plan view of a substrate 15 on which a microphone chip 12 and a circuit element 13 are mounted, and FIG. 4B is a cross-sectional view of the microphone 51 taken along an area corresponding to line X2-X2 in FIG. 4A.

The microphone 51 of the second embodiment differs from the microphone 11 of the first embodiment in that the acoustic perforation 16 is arranged not in the cover 14 but at a position deviated from the circuit element 13 in the substrate 15. In particular, the acoustic perforation 16 is opened at a position adjacent to the circuit element 13 to miniaturize the microphone 51. The structure substantially similar to the microphone 11 of the first embodiment is adopted for other aspects, and thus the same reference numerals are denoted for the same configuring portions in the drawings and the description will be omitted. Functions and effects similar to the first embodiment are also obtained in such a microphone 51.

Third Embodiment

Figure 5A:
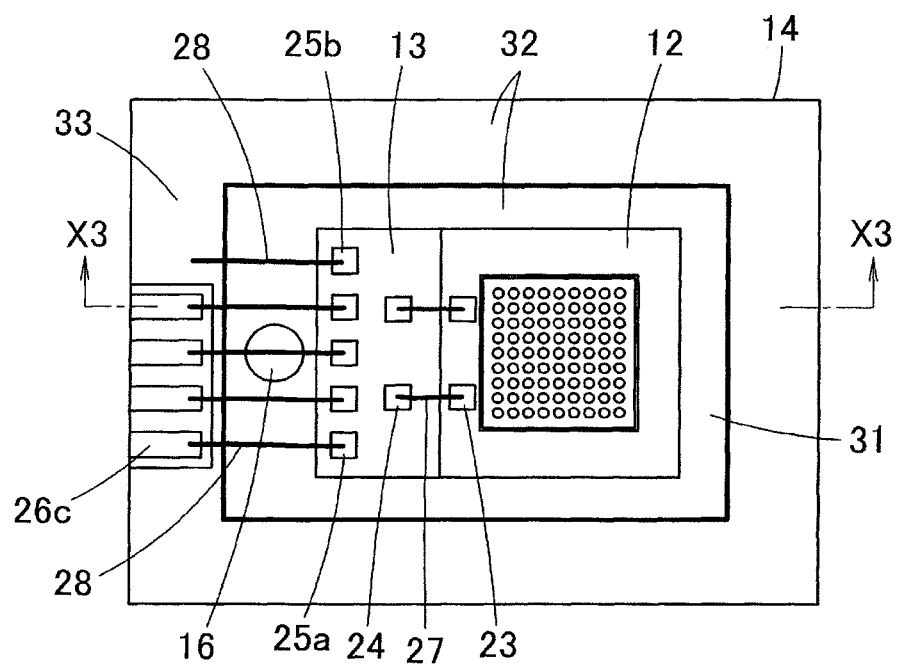
FIG. 5A is a bottom view showing a cover of a microphone according to a third embodiment of the present invention.
Figure 5B:
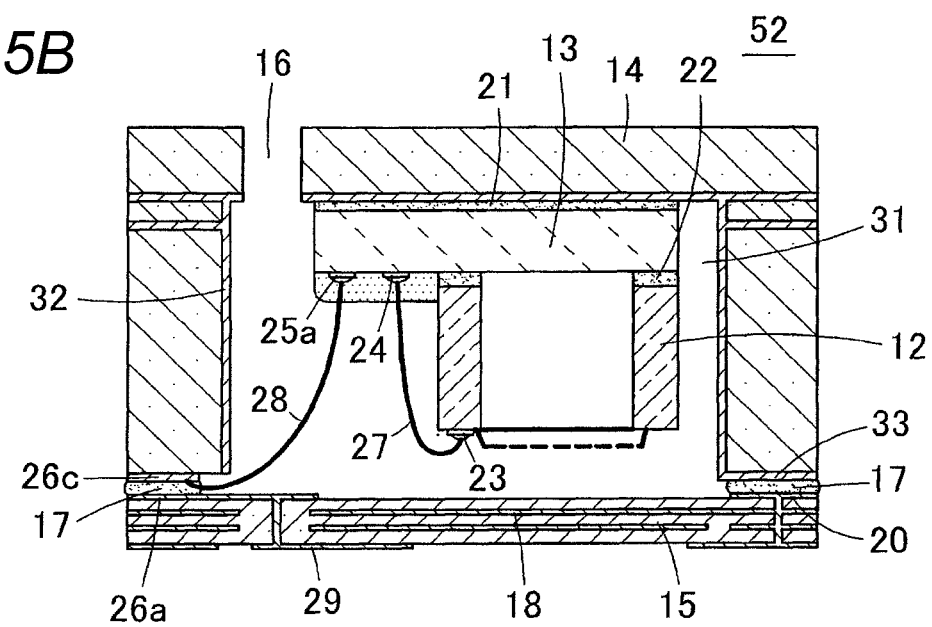
FIG. 5B is a cross-sectional view of the microphone of the third embodiment taken along a portion corresponding to line X3-X3 in FIG. 5A.

A microphone 52 according to a third embodiment of the present invention will now be described. FIG. 5A is a bottom view of the cover 14 on which the microphone chip 12 and the circuit element 13 are mounted in the microphone 52 of the third embodiment, and FIG. 5B is a cross-sectional view of the microphone 52 taken along an area corresponding to line X3-X3 in FIG. 5A.

In the microphone 52 of the third embodiment, the circuit element 13 and the microphone chip 12 are installed on the lower surface of the cover 14 while being turned upside down. In other words, the circuit element 13 is installed on the top surface in the recess 31 of the cover 14 by the die attach material 21 while being turned upside down. The microphone chip 12 is fixed to the lower surface of the circuit element 13 by the die attach material 22 while being turned upside down. A plurality of pad portions 26c is arranged on the lower surface of the cover 14 while being electrically insulated with the cover side joining portion 33 (conductive layer 32).

The microphone terminal 23 arranged on the lower surface of the microphone chip 12 and the input/output terminal 24 arranged on the lower surface of the circuit element 13 are connected by the bonding wire 27. The input/output terminal 25a arranged at the lower surface of the circuit element 13 is connected to the pad portion 26c at the lower surface of the cover 14 by the bonding wire 28, and the ground terminal 25b is connected to the cover side joining portion 33 by the bonding wire 28.

The cover 14 on which the microphone chip 12 and the circuit element 13 are mounted is overlapped on the substrate 15, and the cover side joining portion 33 and the substrate side joining portion 20 are joined by the conductive material 17. The pad portion 26a is arranged at a position facing the pad portion 26c when the cover 14 is overlapped at the upper surface of the substrate 15, and the pad portion 26a is conducted with the external connection terminal 29 arranged at the back surface of the substrate 15. When overlapping the cover 14 on the substrate 15, the pad portion 26c of the cover 14 is connected to the pad portion 26a of the substrate 15 by the conductive material 17.

Therefore, the conductive layer 32 of the cover 14 is conducted with the conductive layer 18 of the substrate 15 through the cover side joining portion 33, the conductive material 17, and the substrate side joining portion 20, and maintained at ground potential. The output signal from the input/output terminal 25a of the circuit element 13 is output from the external connection terminal 29 through the pad portion 26c, the conductive material 17, and the pad portion 26a.

The acoustic perforation 16 for introducing the acoustic vibration into the package is arranged in the cover 14 at the position adjacent to the circuit element 13.

In the microphone 52 of the third embodiment as well, the microphone chip 12 and the circuit element 13 are mounted in the cover 14 so as to be stacked, and hence the microphone 52 can be miniaturized and in particular, the mounting area of the microphone 52 can be reduced. Furthermore, the assembly task is facilitated because the cover 14 is overlapped and joined to the upper surface of the substrate 15 after the wiring of the microphone chip 12 and the circuit element 13 is carried out by the bonding wire 27 and the wiring of the circuit element 13 and the pad portion 26c by the bonding wire 28 is completed.

Fourth Embodiment

Figure 6A:
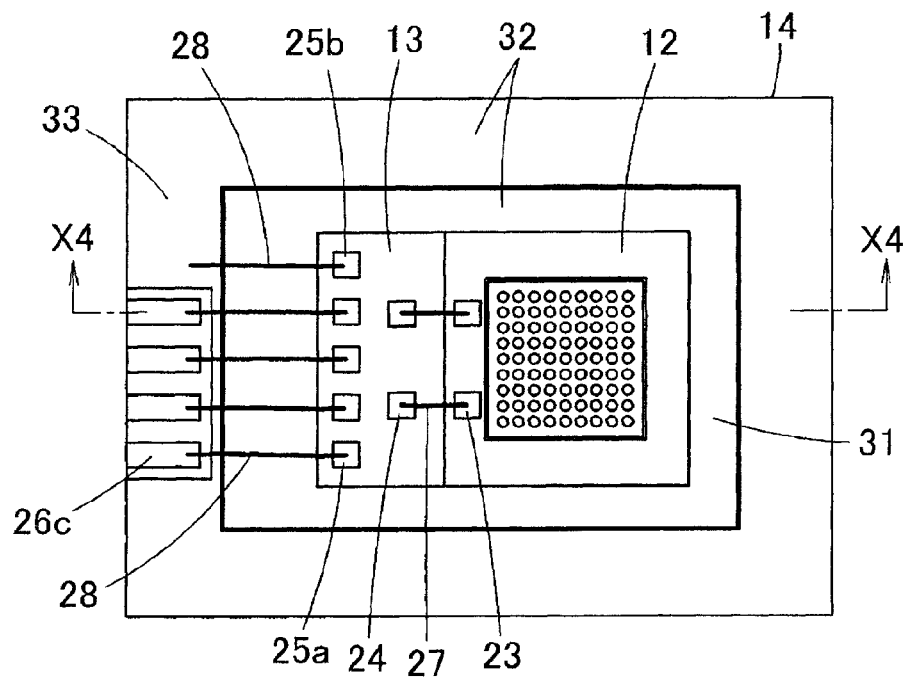
FIG. 6A is a bottom view showing a cover of a microphone according to a fourth embodiment of the present invention.
Figure 6B:
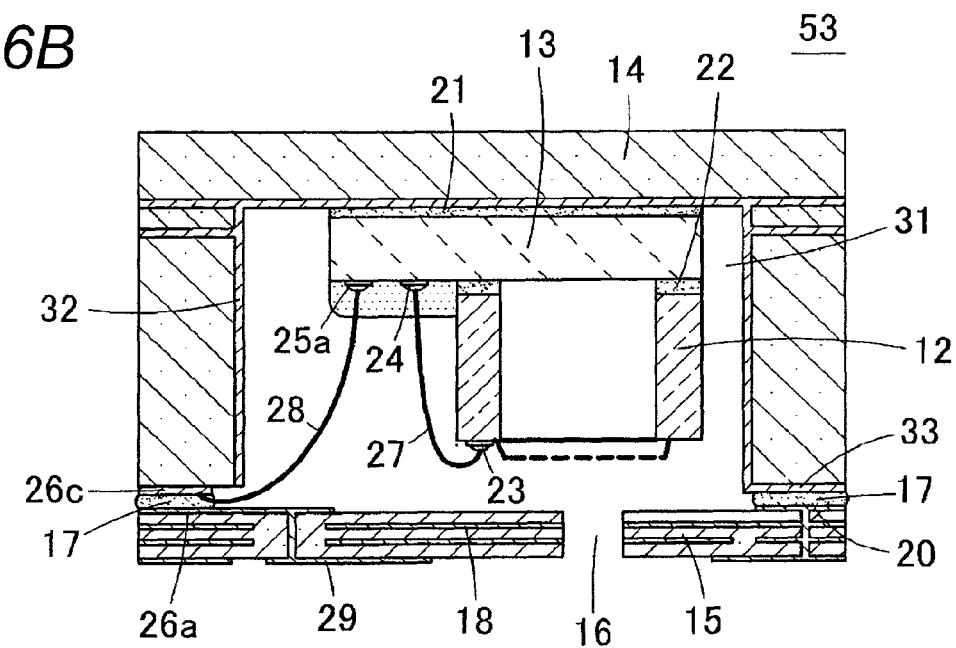
FIG. 6B is a cross-sectional view of the microphone of the fourth embodiment taken along a portion corresponding to line X4-X4 in FIG. 6A.

FIG. 6A is a bottom view of the cover 14 on which the microphone chip 12 and the circuit element 13 are mounted in a microphone 53 of a fourth embodiment of the present invention, and FIG. 6B is a cross-sectional view of the microphone 53 taken along an area corresponding to line X4-X4 in FIG. 6A.

The microphone 53 of the fourth embodiment differs from the microphone 52 of the third embodiment in that the acoustic perforation 16 is arranged not in the cover 14 but in the substrate 15.

Fifth Embodiment

Figure 7A:
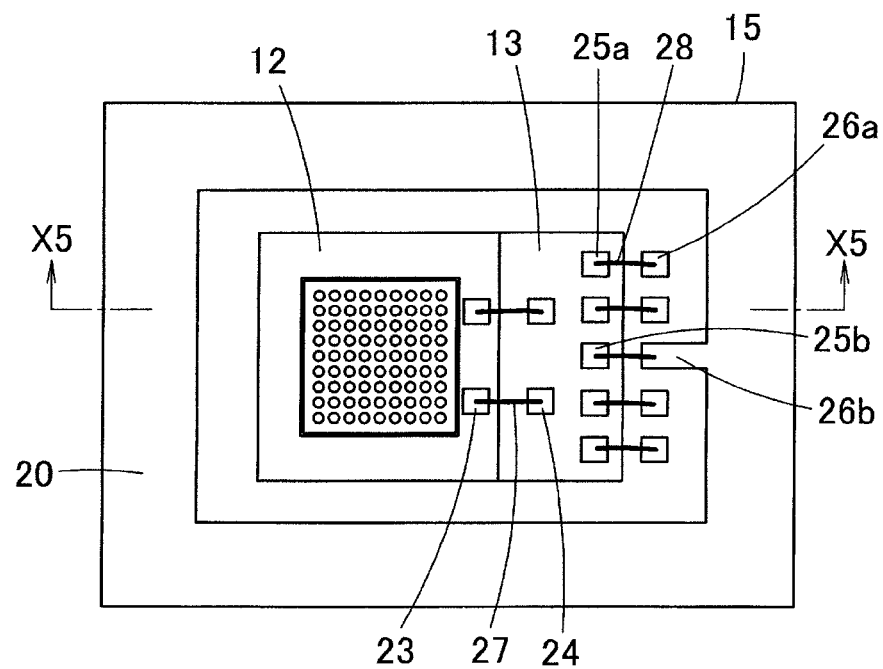
FIG. 7A is a plan view showing a substrate of a microphone according to a fifth embodiment of the present invention.
Figure 7B:
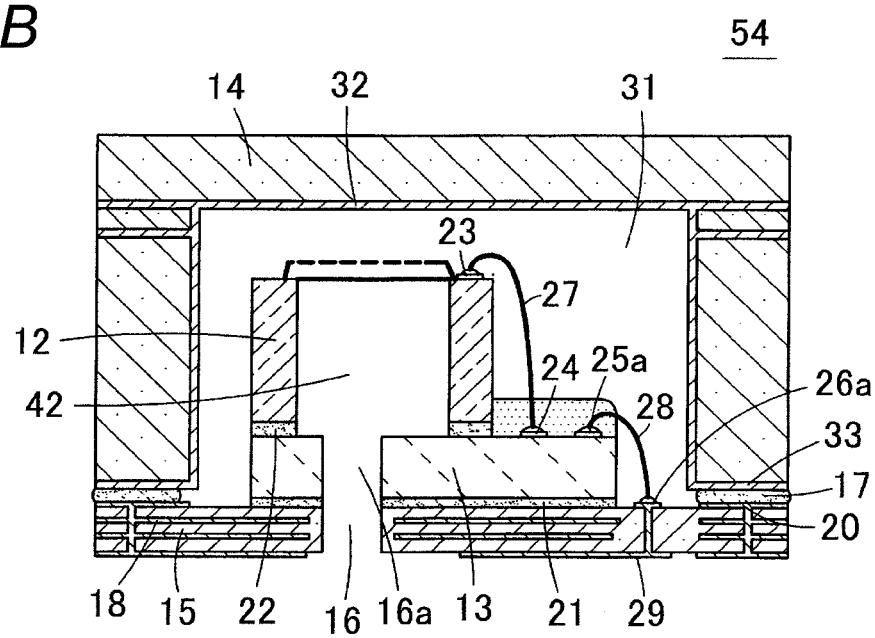
FIG. 7B is a cross-sectional view of the microphone of the fifth embodiment taken along a portion corresponding to line X5-X5 in FIG. 7A.

FIG. 7A is a plan view of the substrate 15 on which the microphone chip 12 and the circuit element 13 are mounted in a microphone 54 according to a fifth embodiment of the present invention, and FIG. 7B is a cross-sectional view of the microphone 54 taken along an area corresponding to line X5-X5 in FIG. 7A.

In the microphone 54 of the fifth embodiment, the circuit element 13 mounted with the microphone chip 12 is mounted on the upper surface of the substrate 15. The acoustic perforations 16, 16a are opened in the substrate 15 and the circuit element 13 at the lower surface of the chamber 42 of the microphone chip 12. Therefore, in the microphone 54, the chamber 42 is a front chamber because the acoustic vibration enters from the lower surface side of the chamber 42. The back chamber of the microphone chip 12 becomes wider because the space in the package becomes the back chamber, whereby the sensitivity of the microphone chip 12 improves.

Sixth Embodiment

Figure 8A:
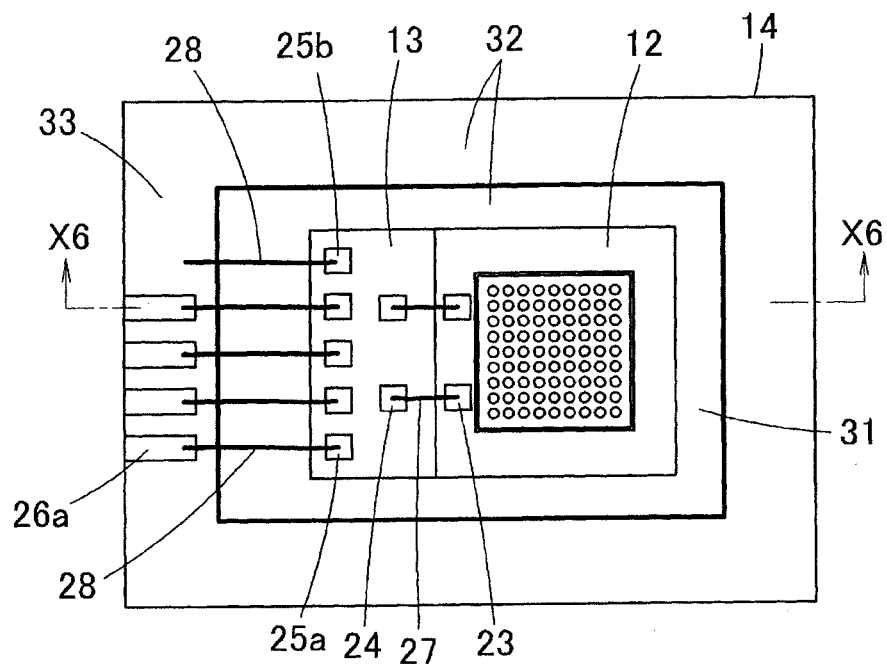
FIG. 8A is a bottom view showing a cover of a microphone according to a sixth embodiment of the present invention.
Figure 8B:
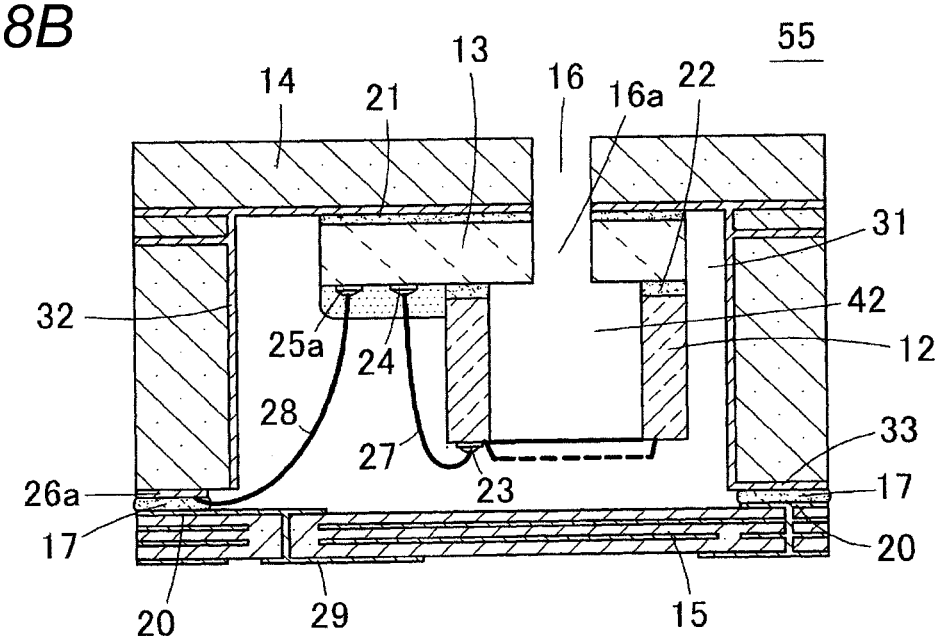
FIG. 8B is a cross-sectional view of the microphone of the sixth embodiment taken along a portion corresponding to line X6-X6 in FIG. 8A.

FIG. 8A is a bottom view of the cover 14, on which the microphone chip 12 and the circuit element 13 are mounted, in a microphone 55 according to a sixth embodiment of the present invention, and FIG. 8B is a cross-sectional view of the microphone 55 taken along an area corresponding to line X6-X6 in FIG. 8A.

In the microphone 55 of the sixth embodiment, the circuit element 13 mounted with the microphone chip 12 is mounted on the lower surface of the cover 14. The acoustic perforations 16, 16a are opened in the cover 14 and the circuit element 13 at the upper surface of the chamber 42 of the microphone chip 12. Therefore, the space in the package becomes the back chamber and the sensitivity of the microphone chip 12 improves in the microphone 55 as well.

Seventh Embodiment

Figure 9A:
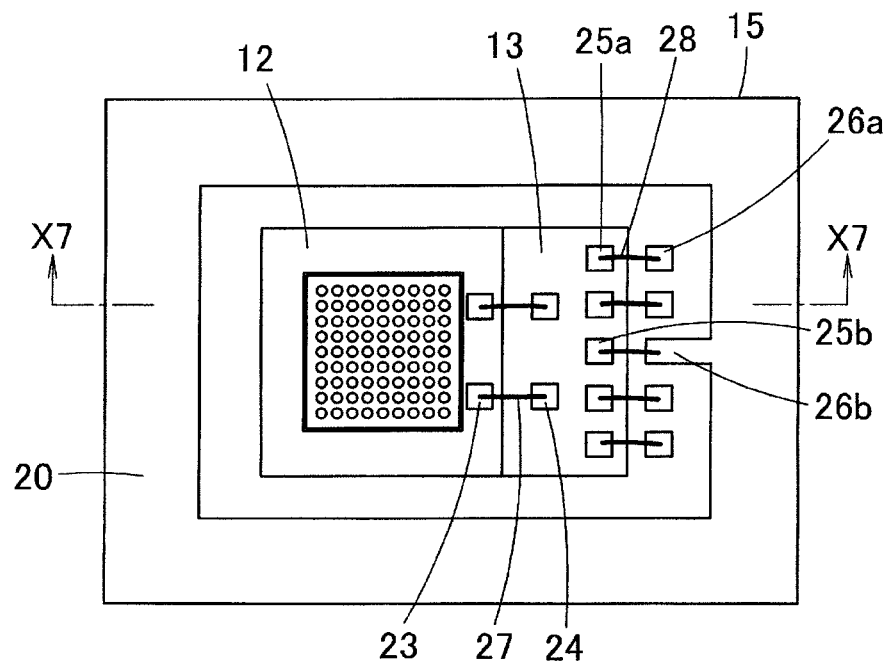
FIG. 9A is a plan view showing a substrate of a microphone according to a seventh embodiment of the present invention.
Figure 9B:
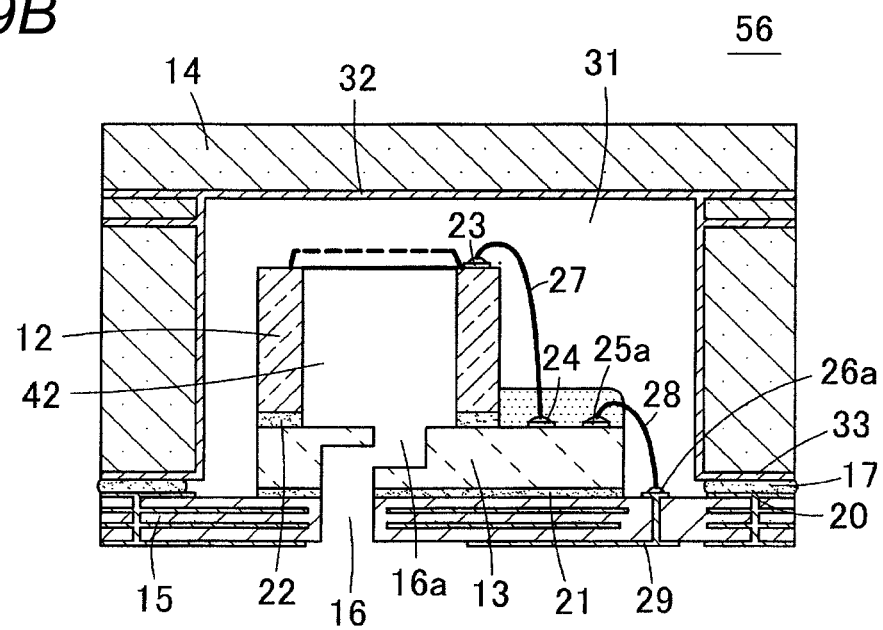
FIG. 9B is a cross-sectional view of the microphone of the seventh embodiment taken along a portion corresponding to line X7-X7 in FIG. 9A.
Figure 10:
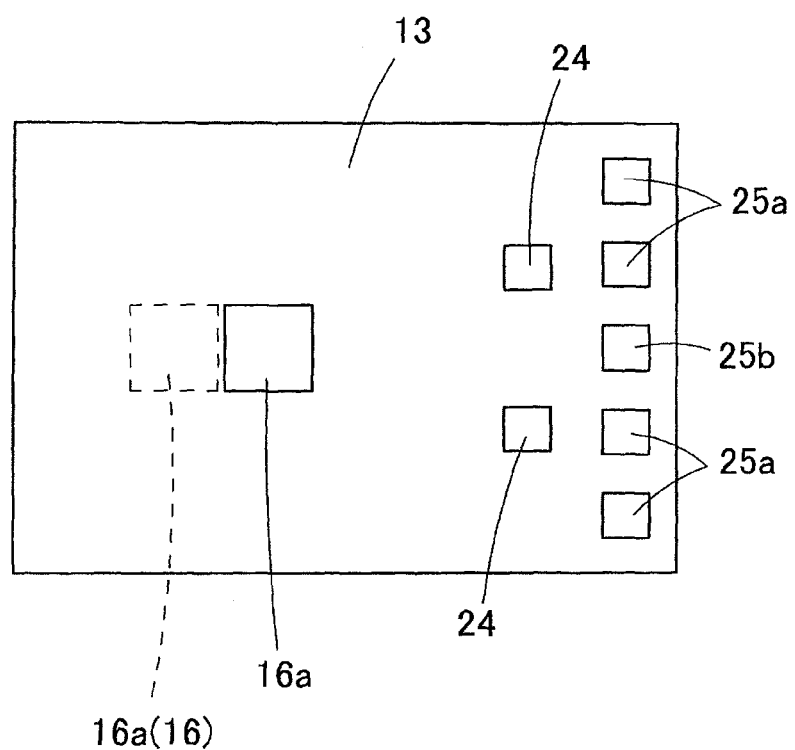
FIG. 10 is a plan view of the circuit element used in the seventh embodiment.

FIG. 9A is a plan view of the substrate 15, on which the microphone chip 12 and the circuit element 13 are mounted, in a microphone 56 according to a seventh embodiment of the present invention, and FIG. 9B is a cross-sectional view of the microphone 56 taken along an area corresponding to line X7-X7 in FIG. 9A. FIG. 10 is a plan view of the circuit element 13 used in the microphone 56 of the seventh embodiment.

In the microphone 56 of the seventh embodiment, the acoustic perforations 16, 16a opened in the substrate 15 and the circuit element 13 at the lower side of the chamber 42 are bent. In FIG. 10, the acoustic perforation 16a is bent in the circuit element 13, but the acoustic perforation 16 may be bent in the substrate 15 or both acoustic perforations 16, 16a may be bent. The acoustic perforation 16 and the acoustic perforation 16a are bent such that the opening on the outer surface side of the package of the acoustic perforation 16 and the opening on the inner surface side of the package (chamber 42 side) of the acoustic perforation 16a do not overlap when viewed from a direction perpendicular to the bottom surface of the package. The acoustic perforations are bent so that one opening cannot be seen linearly from the other opening.

In the microphone 56, the acoustic perforations 16, 16a are bent and the opening on the outer surface side of the package of the acoustic perforation 16 and the opening on the inner surface side of the package of the acoustic perforation 16a are not overlapped when viewed from the direction perpendicular to the bottom surface of the package, and hence foreign substances such as dust are less likely to enter the chamber 42 from the acoustic perforations 16, 16a, so that the lowering of the performance of the microphone chip 12 when the foreign substance that entered clogs up, for example, the gap between the diaphragm 43 and the Si substrate 41 can be prevented. Furthermore, the acoustic perforations 16, 16a are bent such that the opening on the inner surface side of the package is not linearly seen from the opening on the outer surface side of the package, and hence light rays, moisture (humidity), and the like are less likely to enter from the acoustic perforations 16, 16a and the microphone chip 12 is less likely to degrade by such environmental factors.

Note that, a case in which the microphone chip 12 and the circuit element 13 are mounted on the substrate 15 has been described, but the acoustic perforations 16, 16a may be bent for a case in which the microphone chip 12 and the circuit element 13 are mounted on the cover 14.

Eighth Embodiment

Figure 11A:
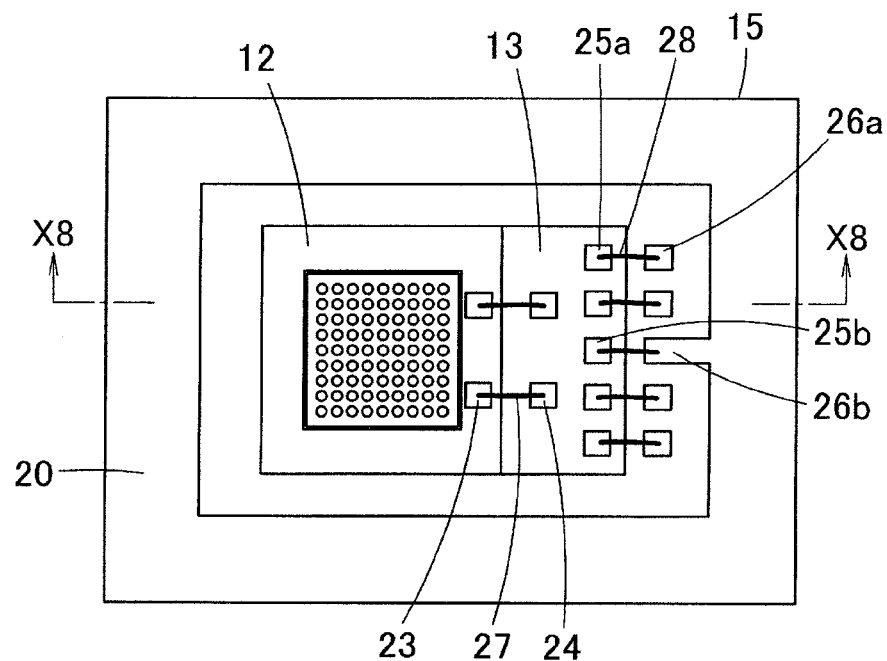
FIG. 11A is a plan view showing the substrate of a microphone according to an eighth embodiment of the present invention.
Figure 11B:
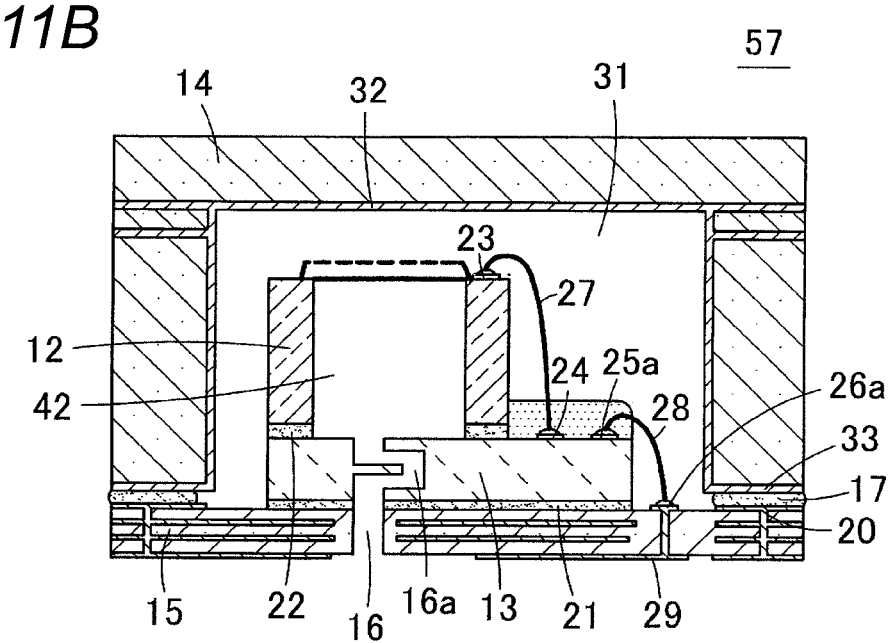
FIG. 11B is a cross-sectional view of the microphone of the eighth embodiment taken along a portion corresponding to line X8-X8 in FIG. 11A.

FIG. 11A is a plan view of the substrate 15, on which the microphone chip 12 and the circuit element 13 are mounted, in a microphone 57 according to an eighth embodiment of the present invention, and FIG. 11B is a cross-sectional view of the microphone 57 taken along an area corresponding to line X8-X8 in FIG. 11A.

In the microphone 57, the circuit element 13 is mounted on the upper surface of the substrate 15, the microphone chip 12 is fixed on the circuit element 13, the acoustic perforation 16 is opened in the substrate 15 at immediately below the microphone chip 12, and the acoustic perforation 16a is opened in the circuit element 13. The acoustic perforation 16 and the acoustic perforation 16a are communicated to each other, where the opening on the outer surface side of the package of the acoustic perforation 16 and the opening on the inner surface side of the package (chamber 42 side) of the acoustic perforation 16a may be substantially overlapped (may be completely overlapped or partially overlapped) when viewed from the direction perpendicular to the bottom surface of the package. The acoustic perforations 16, 16a are bent such that the opening on the inner surface side of the package is not linearly seen from the opening on the outer surface side of the package. To this end, the acoustic perforations 16, 16a are refracted twice, as shown in FIG. 11B.

Therefore, in the microphone 57 as well, foreign substances such as dust are less likely to enter the chamber 42 from the acoustic perforations 16, 16a because the acoustic perforations 16, 16a are bent such that the opening on the inner surface side of the package cannot be linearly seen from the opening on the outer surface side of the package. Furthermore, light rays, moisture (humidity), and the like are also less likely to enter from the acoustic perforations 16, 16a, so that the microphone chip 12 is not likely to degrade by such environmental factors.

The shape or structure of the acoustic perforations in the seventh embodiment and the eighth embodiment can be applied to the acoustic perforations formed in the cover or the acoustic perforations formed in a member different from the member on which the circuit element and the microphone chip are mounted.

One opening may be seen from the other opening when the opening on the outer surface side of the package of the acoustic perforation 16 and the opening on the inner surface side of the package of the acoustic perforation 16a are overlapped at least partially or not overlapped when viewed from the direction perpendicular to the bottom surface of the package. In this case, the effect of preventing foreign substances, light rays, moisture, and the like from entering lowers but the acoustic vibration can be easily transmitted to the microphone chip 12.

Ninth Embodiment

Figure 12A:
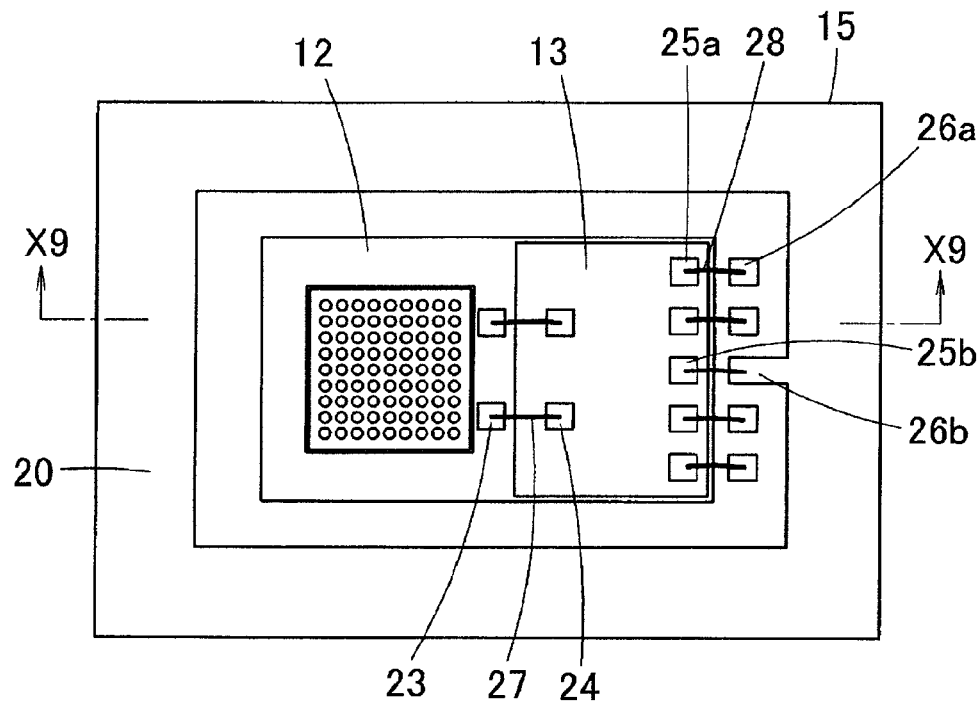
FIG. 12A is a plan view showing the substrate of a microphone according to a ninth embodiment of the present invention.
Figure 12B:
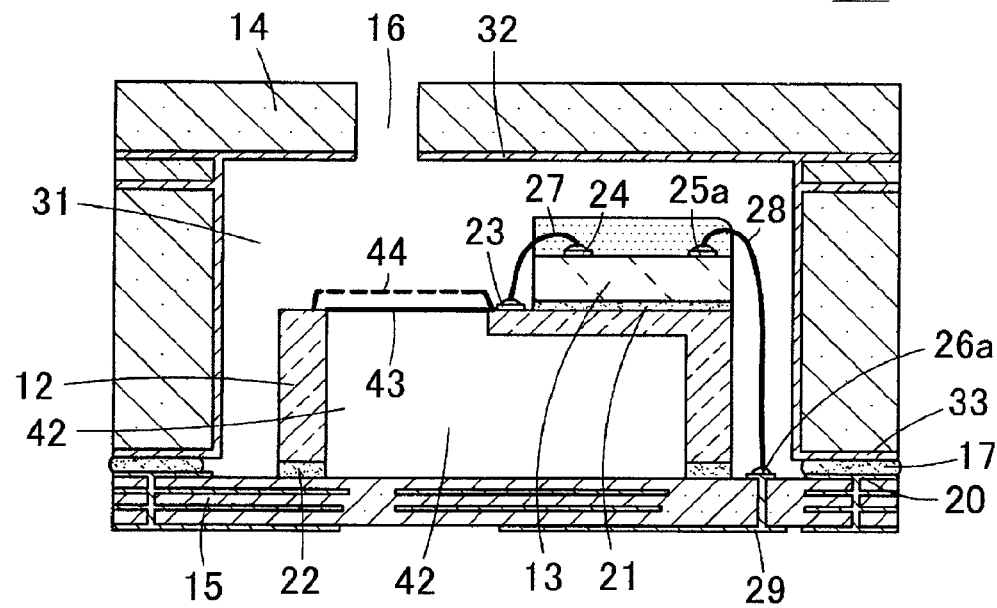
FIG. 12B is a cross-sectional view of the microphone of the ninth embodiment taken along a portion corresponding to line X9-X9 in FIG. 12A.

FIG. 12A is a plan view of the substrate 15, on which the microphone chip 12 and the circuit element 13 are mounted, in a microphone 58 according to a ninth embodiment of the present invention, and FIG. 12B is a cross-sectional view of the microphone 58 taken along an area corresponding to line X9-X9 in FIG. 12A.

In the microphone 58, the microphone chip 12 is fixed to the upper surface of the substrate 15 by the die attach material 22, and the circuit element 13 is fixed to the upper surface of the microphone chip 12 by the die attach material 21. The microphone chip 12 has a larger area than the diaphragm 43 and the back plate 44 in plan view, and the circuit element 13 is arranged in a region where the diaphragm 43, the back plate 44, and the microphone terminal 23 are not arranged in the upper surface of the microphone chip 12.

In this case as well, the microphone terminal 23 of the microphone chip 12 and the input/output terminal 24 of the circuit element 13 are connected with the bonding wire 27, the input/output terminal 25a of the circuit element 13 and the pad portion 26a of the substrate 15 are connected with the bonding wire 28, and the ground terminal 25b of the circuit element 13 and the pad portion 26b of the substrate 15 are connected with the bonding wire 28.

Therefore, the circuit element 13 can be stacked on the microphone chip 12, so that the microphone 58 can be miniaturized and in particular, the mounting area can be reduced in this mode as well. In the microphone 58, the chamber 42 becomes the back chamber of the microphone chip 12 and the capacity of the back chamber can be increased, so that the sensitivity of the microphone chip 12 can be enhanced.

Tenth Embodiment

Figure 13A:
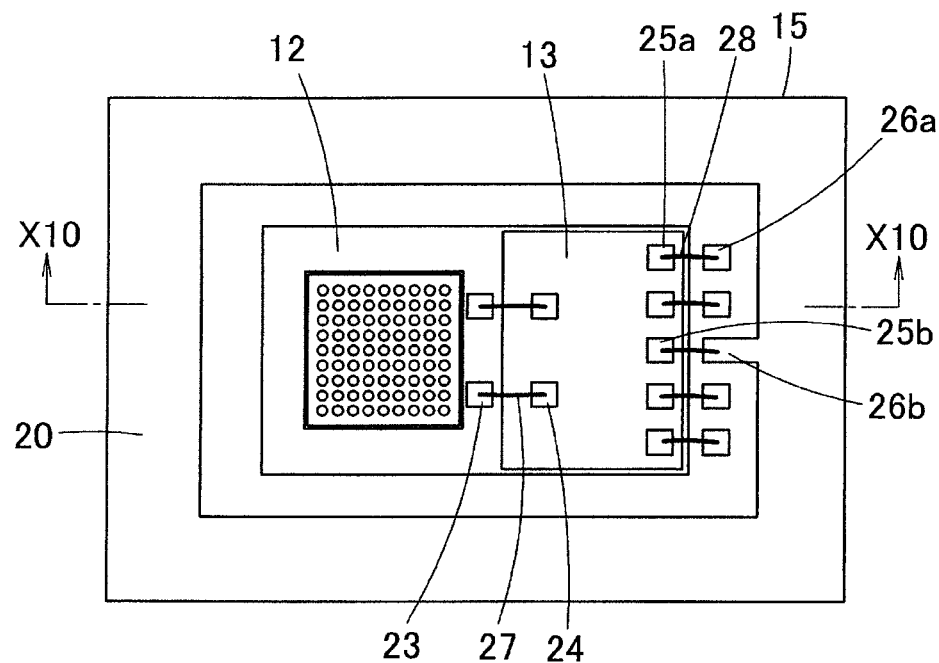
FIG. 13A is a plan view showing the substrate of a microphone according to a tenth embodiment of the present invention.
Figure 13B:
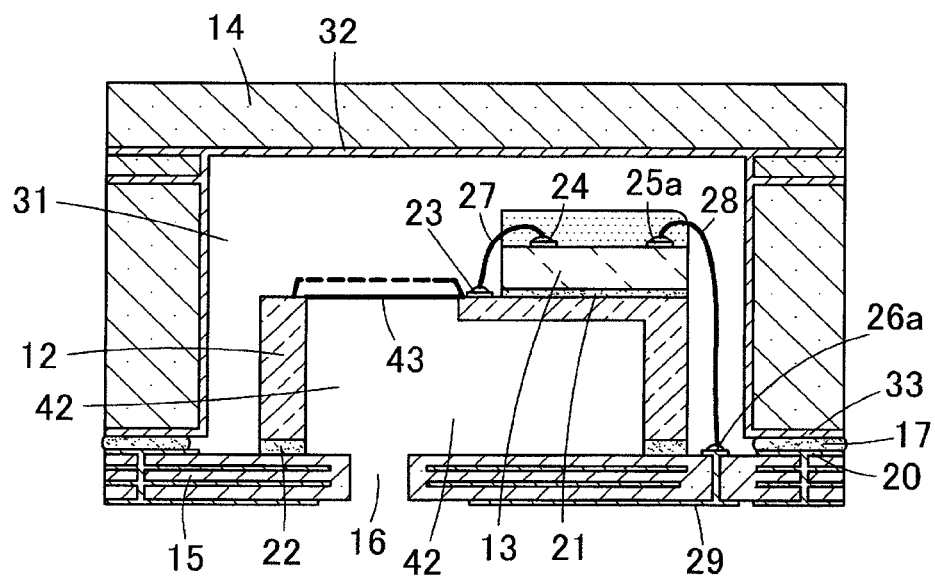
FIG. 13B is a cross-sectional view of the microphone of the tenth embodiment taken along a portion corresponding to line X10-X10 in FIG. 13A.

FIG. 13A is a plan view of the substrate 15, on which the microphone chip 12 and the circuit element 13 are mounted, in a microphone 59 according to a tenth embodiment of the present invention, and FIG. 13B is a cross-sectional view of the microphone 59 taken along an area corresponding to line X10-X10 in FIG. 13A.

The microphone 59 has a structure substantially similar to the microphone 58 of the ninth embodiment, but differs in that the acoustic perforation 16 is opened in the substrate 15 so as to communicate to the chamber 42 of the microphone chip 12 at the position facing the diaphragm 43.

Eleventh Embodiment

Figure 14A:
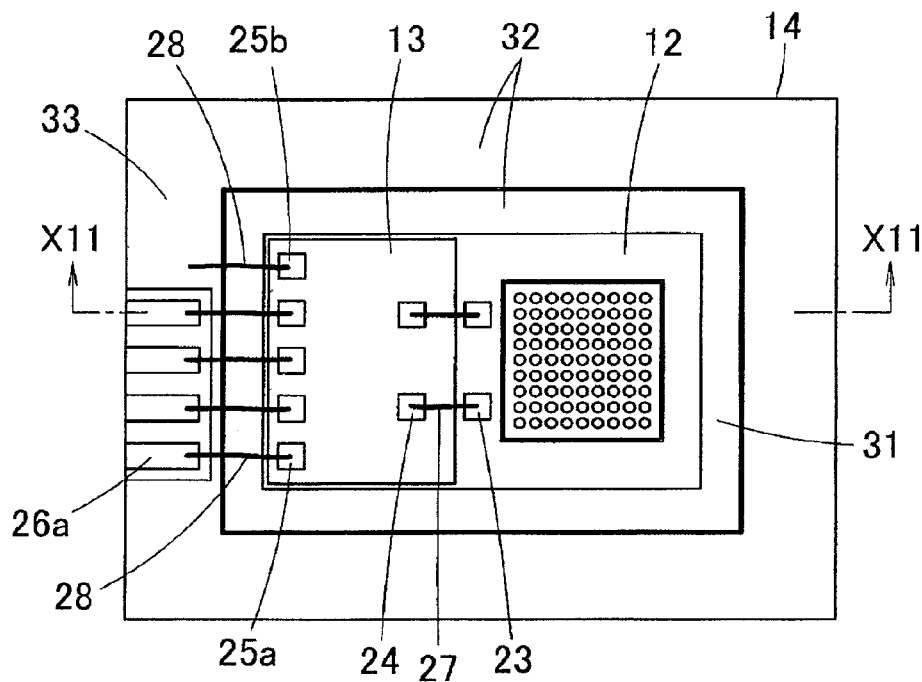
FIG. 14A is a bottom view showing the cover of a microphone according to an eleventh embodiment of the present invention.
Figure 14B:
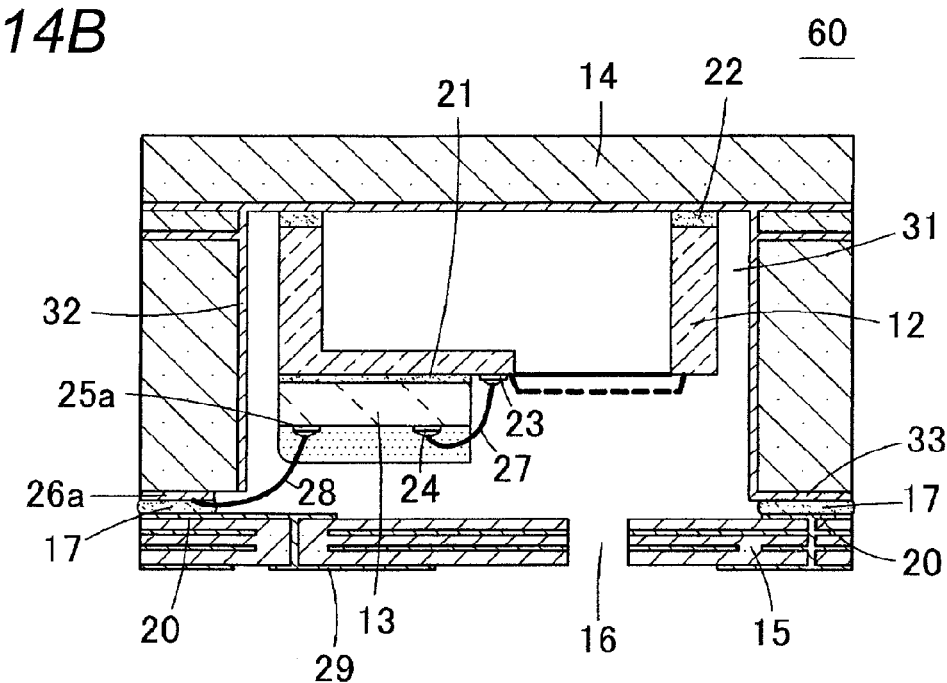
FIG. 14B is a cross-sectional view of the microphone of the eleventh embodiment taken along a portion corresponding to line X11-X11 in FIG. 14A.

FIG. 14A is a bottom view of the cover 14, on which the microphone chip 12 and the circuit element 13 are mounted, in a microphone 60 according to an eleventh embodiment of the present invention, and FIG. 14B is a cross-sectional view of the microphone 60 taken along an area corresponding to line X11-X11 in FIG. 14A.

The microphone 60 has the microphone chip 12, on the upper surface of which the circuit element 13 is arranged, turned upside down and installed at the lower surface of the cover 14, and the acoustic perforation 16 opened in the substrate 15.

Twelfth Embodiment

Figure 15A:
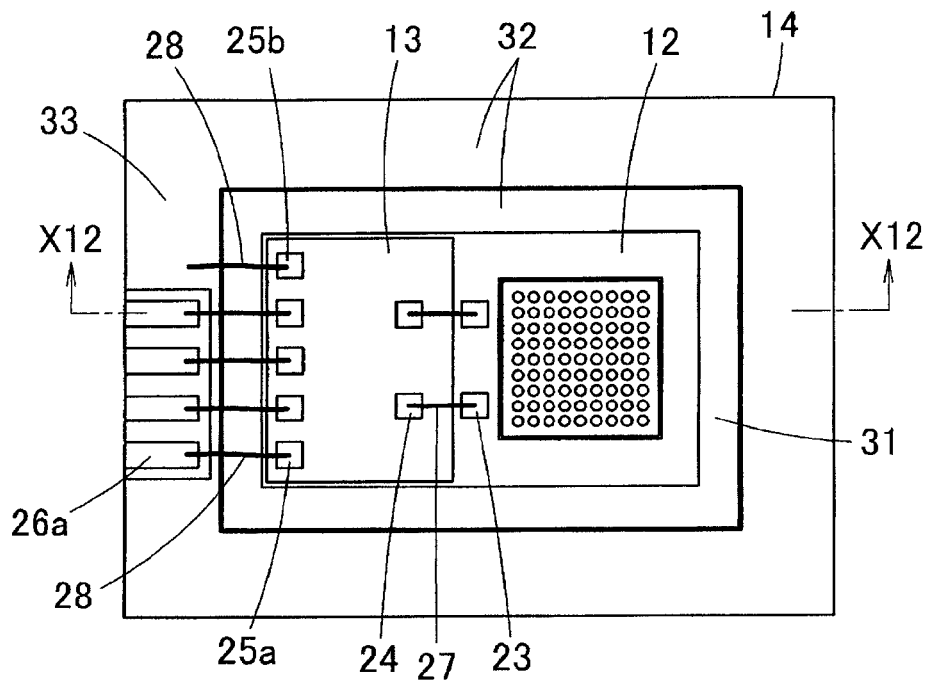
FIG. 15A is a bottom view showing the cover of a microphone according to a twelfth embodiment of the present invention.
Figure 15B:
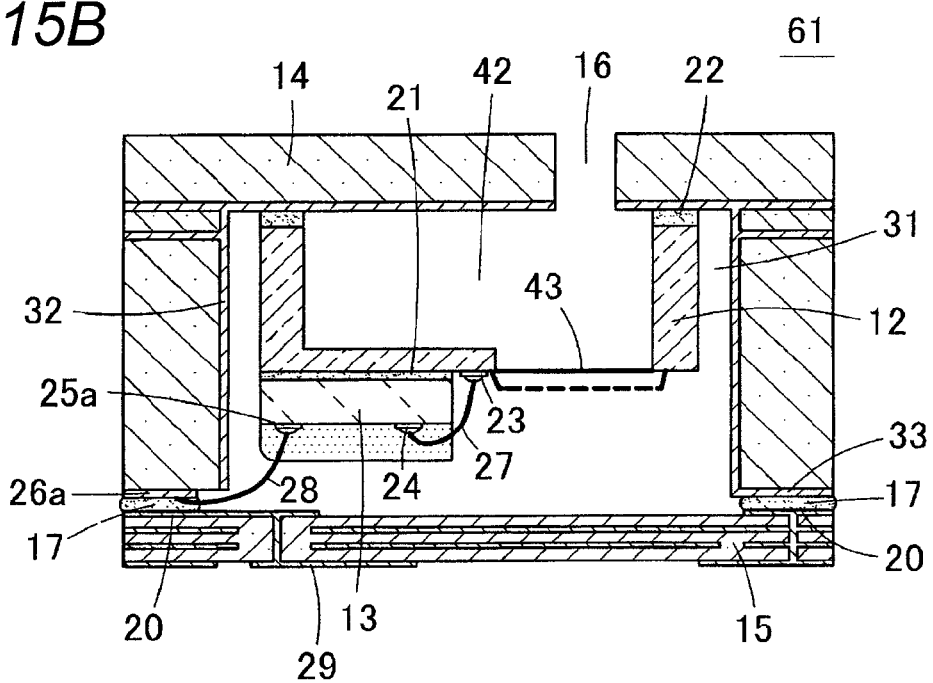
FIG. 15B is a cross-sectional view of the microphone of the twelfth embodiment taken along a portion corresponding to line X12-X12 in FIG. 15A.

FIG. 15A is a bottom view of the cover 14, on which the microphone chip 12 and the circuit element 13 are mounted, in a microphone 61 according to a twelfth embodiment of the present invention, and FIG. 15B is a cross-sectional view of the microphone 61 taken along an area corresponding to line X12-X12 in FIG. 15A.

The microphone 61 has the microphone chip 12, on the upper surface of which the circuit element 13 is arranged, turned upside down and installed at the lower surface of the cover 14, and the acoustic perforation 16 opened in the cover 14 so as to communicate to the chamber 42 of the microphone chip 12 at the position facing the diaphragm 43.

Thirteenth Embodiment

Figure 16A:
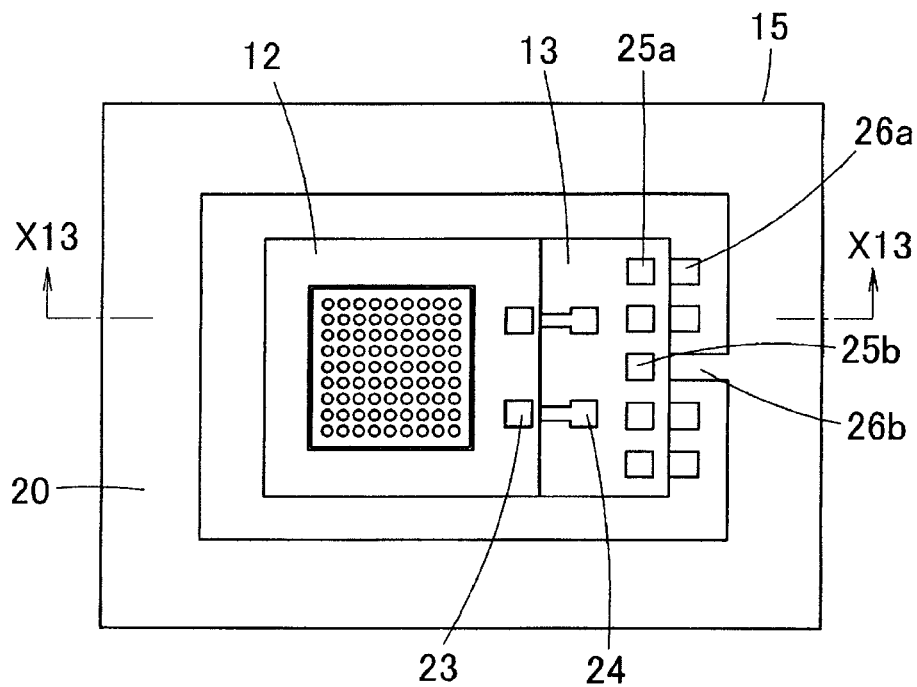
FIG. 16A is a plan view showing the substrate of a microphone according to a thirteenth embodiment of the present invention.
Figure 16B:
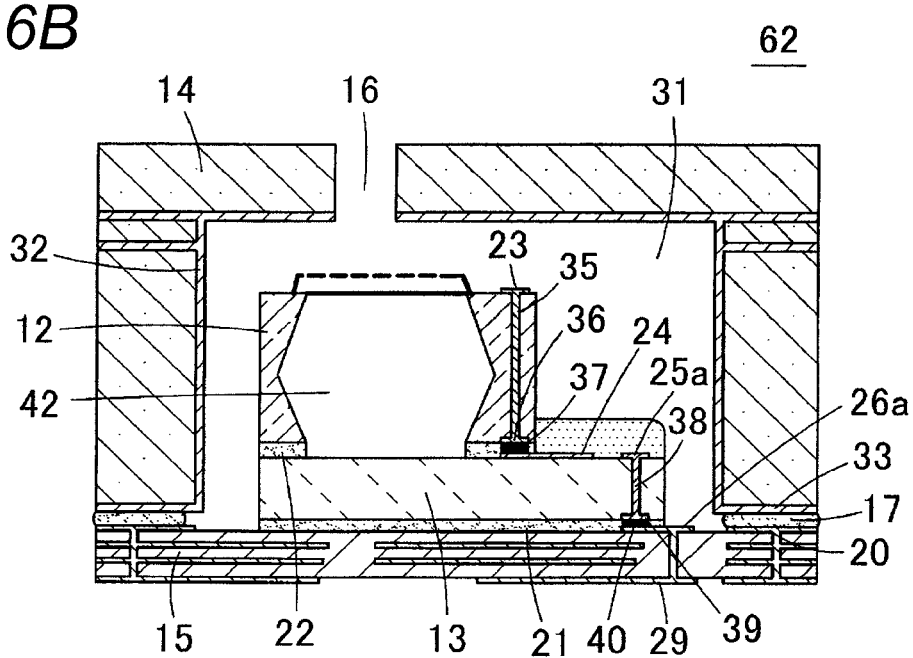
FIG. 16B is a cross-sectional view of the microphone of the thirteenth embodiment taken along a portion corresponding to line X13-X13 in FIG. 16A.

FIG. 16A is a plan view of the substrate 15, on which the microphone chip 12 and the circuit element 13 are mounted, in a microphone 62 according to a thirteenth embodiment of the present invention, and FIG. 16B is a cross-sectional view of the microphone 62 taken along an area corresponding to line X13-X13 in FIG. 16A.

In the microphone 62, a connection terminal 36 is provided at the lower surface of the microphone chip 12 in correspondence with the microphone terminal 23 provided at the upper surface of the microphone chip 12, and the microphone terminal 23 at the upper surface and the connection terminal 36 at the lower surface are conducted by a through-electrode 35 passing through the microphone chip 12 in the up and down direction. Furthermore, a connection terminal 39 is provided at the lower surface of the circuit element 13 in correspondence with the input/output terminal 25a provided at the upper surface of the circuit element 13, and the input/output terminal 25a at the upper surface and the connection terminal 39 at the lower surface are conducted by a through-electrode 38 passing through the circuit element 13 in the up and down direction.

The microphone chip 12 connects the microphone terminal 23 at the upper surface to the input/output terminal 24 of the circuit element 13 by connecting the connection terminal 36 at the lower surface to the input/output terminal 24 at the upper surface of the circuit element 13 by a solder 37. Furthermore, the circuit element 13 connects the input/output terminal 25a at the upper surface to the pad portion 26a of the substrate by connecting the connection terminal 39 at the lower surface to the pad portion 26a of the substrate 15 by a solder 40.

Similar to the input/output terminal 25a, the ground terminal 25b at the upper surface of the circuit element 13 is also connected to the pad portion 26b of the substrate 15 using a through-electrode, but this is not shown in the drawing.

If the microphone chip 12 and the circuit element 13, and the circuit element 13 and the substrate 15 are connected using the through-electrode in the above manner, the possibility of bending like the bonding wire and making contact with other circuit elements is eliminated, and the short circuit accidents of the microphone 62 can be prevented.

Fourteenth Embodiment

Figure 17A:
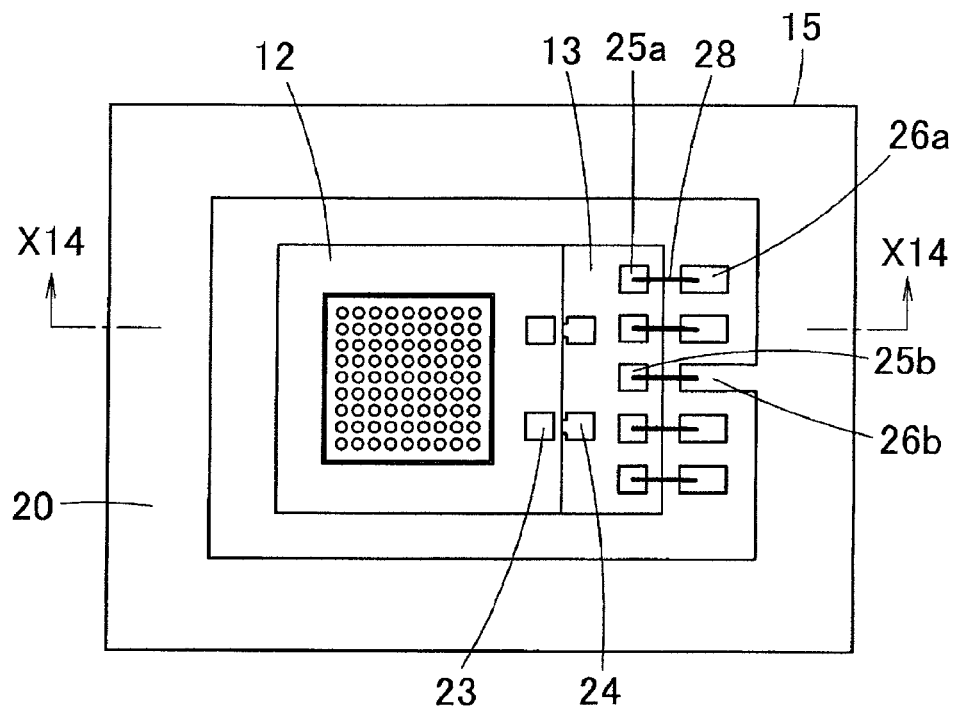
FIG. 17A is a plan view showing the substrate of a microphone according to a fourteenth embodiment of the present invention.
Figure 17B:
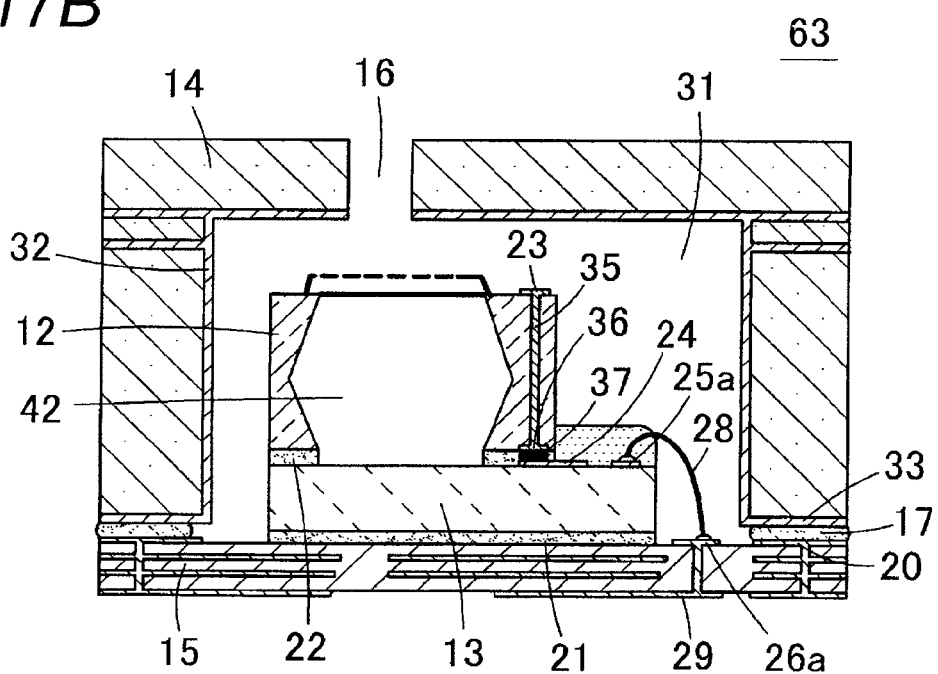
FIG. 17B is a cross-sectional view of the microphone of the fourteenth embodiment taken along a portion corresponding to line X14-X14 in FIG. 17A.

FIG. 17A is a plan view of the substrate 15, on which the microphone chip 12 and the circuit element 13 are mounted, in a microphone 63 according to a fourteenth embodiment of the present invention, and FIG. 17B is a cross-sectional view of the microphone 63 taken along an area corresponding to line X14-X14 in FIG. 17A.

In the microphone 63, the connection terminal 36 provided at the lower surface of the microphone chip 12 is connected to the input/output terminal 24 at the upper surface of the circuit element 13 by the solder, so that the microphone terminal 23 at the upper surface of the microphone chip 12 is connected to the input/output terminal 24 of the circuit element 13. Furthermore, the input/output terminal 25a and the ground terminal 25b provided at the upper surface of the circuit element 13 are connected to the pad portions 26a, 26b of the substrate 15 by the bonding wire 28.

In each embodiment described above, the bonding wire can be appropriately replaced with the through-electrode. For example, in the microphone 11 of FIGS. 2A and 2B, only the bonding wire 28 connecting the circuit element 13 and the substrate 15 may be replaced with the through-electrode. Furthermore, even in the case in which the microphone chip 12 and the circuit element 13 are mounted on the cover 14 as in the microphone 52 of FIGS. 5A and 5B, the bonding wire 27 connecting the microphone chip 12 and the circuit element 13 can be replaced with the through-electrode.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A microphone comprising:
a package including a cover and a substrate, at least one of which has a recess;
a circuit element installed on an inner surface of the cover;
wherein the circuit element is arranged on the surface of a microphone chip on which a diaphragm is arranged and the circuit element is arranged outside the area where the diaphragm is arranged;
wherein the microphone further comprises:
a microphone terminal arranged on the microphone chip and a plurality of input/output terminals arranged on the circuit element,
wherein the microphone terminal and some of the plurality of input/output terminals are connected by a wire wiring,
wherein the remaining input/output terminals arranged on the circuit element and a pad portion arranged on a surface facing the substrate of the cover are connected by a wire wiring, and
wherein the pad portion arranged on the cover and a pad portion arranged on the substrate are joined by a conductive material.

2. A microphone comprising:
a package including a cover and a substrate, at least one of which has a recess;
a microphone chip installed on an inner surface of the cover; and
a circuit element arranged on a surface of the microphone chip on an opposite side of an installing surface of the microphone chip, wherein the circuit element is arranged on the surface of the microphone chip on which a diaphragm is arranged and the circuit element is arranged outside the area where the diaphragm is arranged;
wherein the microphone further comprises:
a microphone terminal arranged on the microphone chip and a plurality of input/output terminals arranged on the circuit element,
wherein the microphone terminal and some of the plurality of input/output terminals are connected by a wire wiring,
wherein the remaining input/output terminals arranged on the circuit element and a pad portion arranged on a surface facing the substrate of the cover are connected by a wire wiring, and
wherein the pad portion arranged on the cover and a pad portion arranged on the substrate are joined by a conductive material.

3. A microphone comprising:
a package including a cover and a substrate, at least one of which has a recess;
a circuit element installed on an inner surface of the cover;
wherein the circuit element is arranged on the surface of a microphone chip on which a diaphragm is arranged and the circuit element is arranged outside the area where the diaphragm is arranged;
wherein the microphone further comprises:
a microphone terminal arranged on the microphone chip and a plurality of input/output terminals arranged on the circuit element,
wherein the microphone terminal and some of the plurality of input/output terminals are connected by a through-wiring arranged in the microphone chip,
wherein the remaining input/output terminals arranged on the circuit element and a pad portion arranged on a surface facing the substrate of the cover are connected by a wire wiring, and
wherein the pad portion arranged on the cover and a pad portion arranged on the substrate are joined by a conductive material.

4. A microphone comprising:
a package including a cover and a substrate, at least one of which has a recess;
a microphone chip installed on an inner surface of the cover; and
a circuit element arranged on a surface of the microphone chip on an opposite side of an installing surface of the microphone chip, wherein the circuit element is arranged on the surface of the microphone chip on which a diaphragm is arranged and the circuit element is arranged outside the area where the diaphragm is arranged;
wherein the microphone further comprises:
a microphone terminal arranged on the microphone chip and a plurality of input/output terminals arranged on the circuit element,
wherein the microphone terminal and some of the plurality of input/output terminals are connected by a through-wiring arranged in the circuit element,
wherein the remaining input/output terminals arranged on the circuit element and a pad portion arranged on a surface facing the substrate of the cover are connected by a wire wiring, and
wherein the pad portion arranged on the cover and a pad portion arranged on the substrate are joined by a conductive material.

5. The microphone according to claim 1, wherein an acoustic perforation for transmitting acoustic vibration into the package is formed in the cover.

6. The microphone according to claim 2, wherein an acoustic perforation for transmitting acoustic vibration into the package is formed in the cover.

7. The microphone according to claim 3, wherein an acoustic perforation for transmitting acoustic vibration into the package is formed in the cover.

8. The microphone according to claim 4, wherein an acoustic perforation for transmitting acoustic vibration into the package is formed in the cover.

9. The microphone according to claim 1, wherein an acoustic perforation for transmitting acoustic vibration into the package is formed in continuation to the cover and the circuit element, and wherein the acoustic perforation has an opening on an outer surface side of the cover and an opening on an inner surface side of the circuit element overlapped at least partly when viewed from a direction perpendicular to a bottom surface of the package.

10. The microphone according to claim 2, wherein an acoustic perforation for transmitting acoustic vibration into the package is formed in continuation to the cover and the circuit element, and wherein the acoustic perforation has an opening on an outer surface side of the cover and an opening on an inner surface side of the circuit element overlapped at least partly when viewed from a direction perpendicular to a bottom surface of the package.

11. The microphone according to claim 3, wherein an acoustic perforation for transmitting acoustic vibration into the package is formed in continuation to the cover and the circuit element, and wherein the acoustic perforation has an opening on an outer surface side of the cover and an opening on an inner surface side of the circuit element overlapped at least partly when viewed from a direction perpendicular to a bottom surface of the package.

12. The microphone according to claim 1, wherein an acoustic perforation for transmitting acoustic vibration into the package is formed in continuation to the cover and the circuit element, and wherein the acoustic perforation has an opening on an outer surface side of the cover and an opening on an inner surface side of the circuit element not overlapped when viewed from a direction perpendicular to a bottom surface of the package.

13. The microphone according to claim 2, wherein an acoustic perforation for transmitting acoustic vibration into the package is formed in continuation to the cover and the circuit element, and wherein the acoustic perforation has an opening on an outer surface side of the cover and an opening on an inner surface side of the circuit element not overlapped when viewed from a direction perpendicular to a bottom surface of the package.

14. The microphone according to claim 3, wherein an acoustic perforation for transmitting acoustic vibration into the package is formed in continuation to the cover and the circuit element, and wherein the acoustic perforation has an opening on an outer surface side of the cover and an opening on an inner surface side of the circuit element not overlapped when viewed from a direction perpendicular to a bottom surface of the package.

15. The microphone according to claim 1, wherein an acoustic perforation for transmitting acoustic vibration into the package is formed in continuation to the cover and the circuit element, and wherein the acoustic perforation is bent so that an opening on an inner surface side of the circuit element is not linearly viewed from an opening on an outer surface side of the cover.

16. The microphone according to claim 2, wherein an acoustic perforation for transmitting acoustic vibration into the package is formed in continuation to the cover and the circuit element, and wherein the acoustic perforation is bent so that an opening on an inner surface side of the circuit element is not linearly viewed from an opening on an outer surface side of the cover.

17. The microphone according to claim 3, wherein an acoustic perforation for transmitting acoustic vibration into the package is formed in continuation to the cover and the circuit element, and wherein the acoustic perforation is bent so that an opening on an inner surface side of the circuit element is not linearly viewed from an opening on an outer surface side of the cover.

18. The microphone according to claim 2, wherein an acoustic perforation for transmitting acoustic vibration into the package is formed in the cover so that at least one part faces the diaphragm of the microphone chip when viewed from a direction perpendicular to a bottom surface of the package.

19. The microphone according to claim 3, wherein an acoustic perforation for transmitting acoustic vibration into the package is formed in the cover so that at least one part faces the diaphragm of the microphone chip when viewed from a direction perpendicular to a bottom surface of the package.

20. The microphone according to claim 4, wherein an acoustic perforation for transmitting acoustic vibration into the package is formed in the cover so that at least one part faces the diaphragm of the microphone chip when viewed from a direction perpendicular to a bottom surface of the package.

21. The microphone according to claim 1, wherein an acoustic perforation for transmitting acoustic vibration into the package is formed in the substrate.

22. The microphone according to claim 2, wherein an acoustic perforation for transmitting acoustic vibration into the package is formed in the substrate.

23. The microphone according to claim 3, wherein an acoustic perforation for transmitting acoustic vibration into the package is formed in the substrate.

24. The microphone according to claim 4, wherein an acoustic perforation for transmitting acoustic vibration into the package is formed in the substrate.

25. The microphone according to claim 21, wherein the acoustic perforation is bent so that an opening on an inner surface side of the substrate is not linearly viewed from an opening on an outer surface side of the substrate.

26. The microphone according to claim 1, wherein at least one of the cover or the substrate is configured by at least one type of materials including a copper laminated stacked plate, glass epoxy, ceramic, plastic, metal, or carbon nanotube.

27. The microphone according to claim 2, wherein at least one of the cover or the substrate is configured by at least one type of materials including a copper laminated stacked plate, glass epoxy, ceramic, plastic, metal, or carbon nanotube.

28. The microphone according to claim 3, wherein at least one of the cover or the substrate is configured by at least one type of materials including a copper laminated stacked plate, glass epoxy, ceramic, plastic, metal, or carbon nanotube.

29. The microphone according to claim 4, wherein at least one of the cover or the substrate is configured by at least one type of materials including a copper laminated stacked plate, glass epoxy, ceramic, plastic, metal, or carbon nanotube.

* * * * *